(12) United States Patent
Seol et al.

(10) Patent No.: US 9,905,299 B2
(45) Date of Patent: Feb. 27, 2018

(54) NONVOLATILE MEMORY DEVICE AND OPERATING METHOD OF NONVOLATILE MEMORY DEVICE

(71) Applicants: Changkyu Seol, Osan-si (KR); Junjin Kong, Yongin-si (KR); Youngsuk Ra, Seoul (KR); Hyejeong So, Suwon-si (KR); Hong Rak Son, Anyang-si (KR)

(72) Inventors: Changkyu Seol, Osan-si (KR); Junjin Kong, Yongin-si (KR); Youngsuk Ra, Seoul (KR); Hyejeong So, Suwon-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/370,079

(22) Filed: Dec. 6, 2016

(65) Prior Publication Data

US 2017/0162266 A1 Jun. 8, 2017

(30) Foreign Application Priority Data

Dec. 7, 2015 (KR) .................. 10-2015-0173273

(51) Int. Cl.
  *G11C 16/04* (2006.01)
  *G11C 16/14* (2006.01)
  *G11C 16/08* (2006.01)
  *G11C 16/26* (2006.01)

(52) U.S. Cl.
  CPC .......... *G11C 16/14* (2013.01); *G11C 16/0466* (2013.01); *G11C 16/08* (2013.01); *G11C 16/26* (2013.01)

(58) Field of Classification Search
  CPC ...... G11C 16/04; G11C 16/14; G11C 16/0466; G11C 16/08
  USPC ........................ 365/185.01–185.33
  See application file for complete search history.

(56) References Cited

U.S. PATENT DOCUMENTS

| 6,046,935 | A | 4/2000 | Takeuchi et al. |
|---|---|---|---|
| 6,522,580 | B2 | 2/2003 | Chen et al. |
| 7,310,347 | B2 | 12/2007 | Lasser |
| 7,679,133 | B2 | 3/2010 | Son et al. |
| 8,245,099 | B2 | 8/2012 | Lasser |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,799,559 | B2 | 8/2014 | Sharon et al. |
| 2008/0285341 | A1* | 11/2008 | Moschiano ........ G11C 16/3418 365/185.02 |

(Continued)

*Primary Examiner* — Harry W Byrne
(74) *Attorney, Agent, or Firm* — Volentine & Whitt, PLLC

(57) ABSTRACT

A nonvolatile memory device includes a memory cell array including a plurality of memory cells, a row decoder circuit connected to the memory cell array through a plurality of word lines; and a page buffer circuit connected to the memory cell array through bit lines. The row decoder circuit applies read voltages to a selected word line during a read operation. During a read operation performed with respect to each of N logical pages (N being a positive integer) of memory cells connected to the selected word line, the row decoder circuit applies a read voltage from among adjacent N read voltages to the selected word line without applying read voltages other than the adjacent N read voltages to the selected word line. The adjacent N read voltages include a second highest read voltage among the read voltages.

8 Claims, 21 Drawing Sheets

(56) References Cited

U.S. PATENT DOCUMENTS

| | | | |
|---|---|---|---|
| 2010/0135075 A1* | 6/2010 | Moschiano | G11C 16/3418 |
| | | | 365/185.02 |
| 2011/0233648 A1 | 9/2011 | Seol et al. | |
| 2014/0157086 A1 | 6/2014 | Sharon et al. | |
| 2014/0379961 A1 | 12/2014 | Lasser | |
| 2015/0058536 A1 | 2/2015 | Seol et al. | |

* cited by examiner

FIG. 2
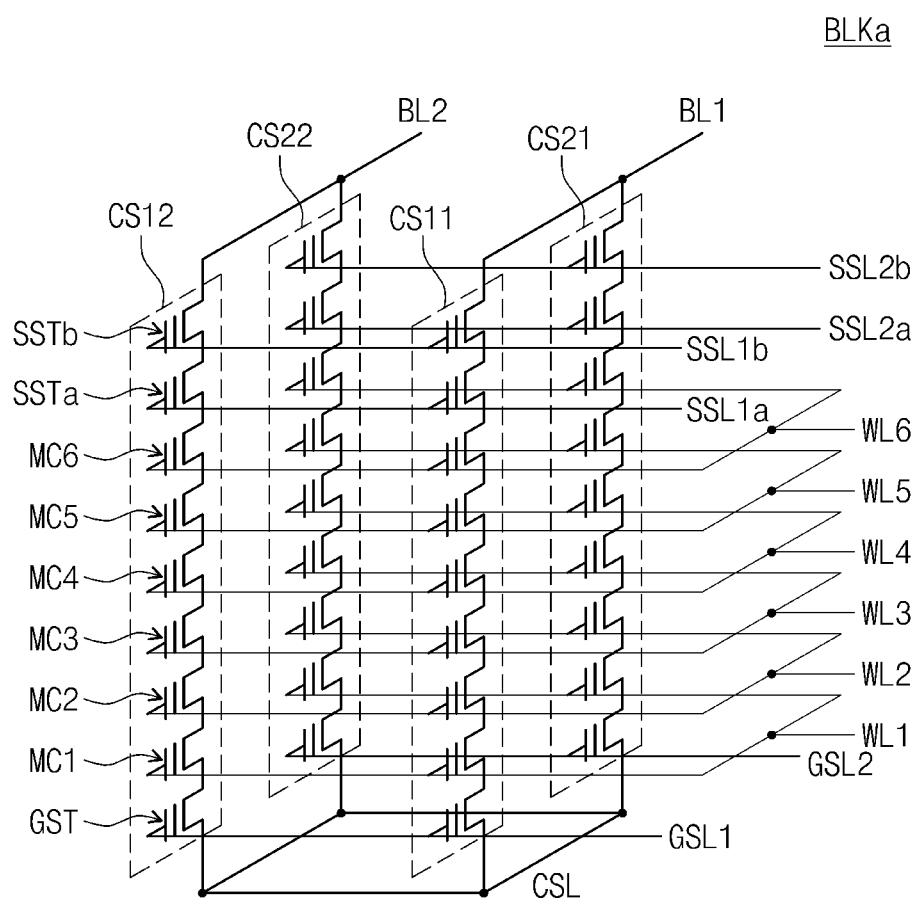
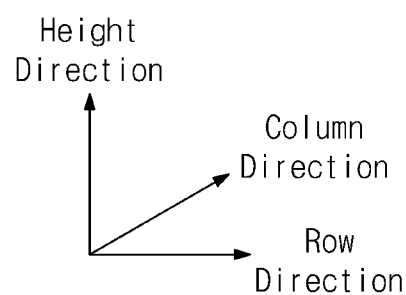

NONVOLATILE MEMORY DEVICE AND OPERATING METHOD OF NONVOLATILE MEMORY DEVICE

CROSS-REFERENCE TO RELATED APPLICATIONS

A claim for priority under 35 U.S.C. § 119 is made to Korean Patent Application No. 10-2015-0173273 filed Dec. 7, 2015, in the Korean Intellectual Property Office, the disclosure of which is incorporated herein in its entirety by reference.

BACKGROUND

The inventive concepts herein relate to a semiconductor memory, and in particular, to a nonvolatile memory device and an operating method thereof.

Storage devices may be referred to as any devices which store data under control of a host device such as a computer, a smart phone, a smart pad, or the like. Hard disk drives (HDD) are storage devices capable of storing data on a magnetic disk. Solid state drives (SSD), memory cards, or the like, are examples of storage devices capable of storing data in semiconductor memory, in particular nonvolatile memory.

Examples of nonvolatile memory include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), or the like.

The operating speed of a host device such as a computer, a smart phone, a smart pad, or the like that communicates with a storage device continues to improve as semiconductor manufacturing technologies develop. The volume of content used in storage devices and used by host devices continues to increase. For these reasons, the demand for storage devices with improved operating speed has continuously trended upward.

As semiconductor manufacturing technologies develop, the degree of integration and the volume of the storage devices continue to increase. Such high integration makes it possible to reduce manufacturing cost of storage devices. However, the high degree of integration has necessitated the scaling-down and structural changes of storage devices. As a result, various new issues and problems have arisen that damage data stored in storage devices, thereby lowering storage device reliability. Methods and devices capable of improving reliability of storage devices are sought.

SUMMARY

Embodiments of the inventive concept provide a nonvolatile memory device with improved speed and reliability and an operating method thereof.

Embodiments of the inventive concept provide a nonvolatile memory device which includes a memory cell array including a plurality of memory cells, a row decoder circuit connected to the memory cell array through a plurality of word lines and configured to apply read voltages to a selected word line during a read operation, and a page buffer circuit connected to the memory cell array through bit lines. During a read operation performed with respect to each of N logical pages (N being a positive integer) of memory cells connected to the selected word line, the row decoder circuit is configured to apply a read voltage from among adjacent N read voltages to the selected word line without applying read voltages other than the adjacent N read voltages to the selected word line. The N adjacent N read voltages include a second highest read among the read voltages.

Embodiments of the inventive concept provide a nonvolatile memory device which includes a memory cell array including a plurality of memory cells, a row decoder circuit connected to the memory cell array through a plurality of word lines and configured to apply a program voltage to a selected word line during a program operation and to apply read voltages to the selected word line during a verification operation. The page buffer circuit is connected to the memory cell array through bit lines. The page buffer circuit includes page buffers respectively connected to the bit lines. Each page buffer is configured to apply a voltage to respective different first bit lines among the bit lines based on N bits (N being a positive integer) to be written in a memory cell during the program operation, and to selectively update the N bit lines based on a voltage variation of the respective different first bit lines during the verification operation. First page buffers among the page buffers storing N bit patterns among bit patterns formed by the N bits are updated while N verification voltages of adjacent levels are sequentially applied to the selected word line during the verification operation. In the N bit patterns stored in the first page buffers, bits of a same location have a single transition point or no transition point according to a sequence of applying the N verification voltages. The N verification voltages include a second highest verification voltage.

Embodiments of the inventive concept provide a method of operating a nonvolatile memory device, the method including receiving N page data at the nonvolatile memory device, and programming memory cells of the nonvolatile memory device to an erase state and first to $(2^N-1)$-th program states by using the N page data. A bit stream of bit values of each page data among the N page data corresponding to the erase state and the first to $(2^N-1)$-th program states has transition points of a number less than or equal to an upper limit or a lower limit corresponding to a value of $2^N/N$. A bit stream of bit values has a single transition point or no transition point in a zone including N program states adjacent to each other. The N program states adjacent to each other include the $(2^N-2)$ program state.

Embodiments of the inventive concept provide a storage device including a nonvolatile memory device including a plurality of memory cells, and a controller configured to receive N page data and to program the memory cells of the nonvolatile memory device to an erase state and first to $(2^N-1)$-th program states using the N page data. The controller is further configured to provide a bit stream of bit values of each page data among the N page data corresponding to the erase state and the first to $(2^N-1)$-th program states that has transition points of a number less than or equal to an upper limit or a lower limit corresponding to a value of $2^N/N$. The bit stream of bit values has a single transition point or no transition point in a zone including N program states adjacent to each other, and the N program states adjacent to each other comprise the $(2^N-2)$ program state.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 2 illustrates a circuit diagram of a memory block according to an embodiment of the inventive concept;

DETAILED DESCRIPTION

Below, embodiments of the inventive concept will be described in detail with reference to the attached drawings to the extent that the scope and spirit of the inventive concept are easily implemented by a person of ordinary skill in the art to which the inventive concept belongs.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
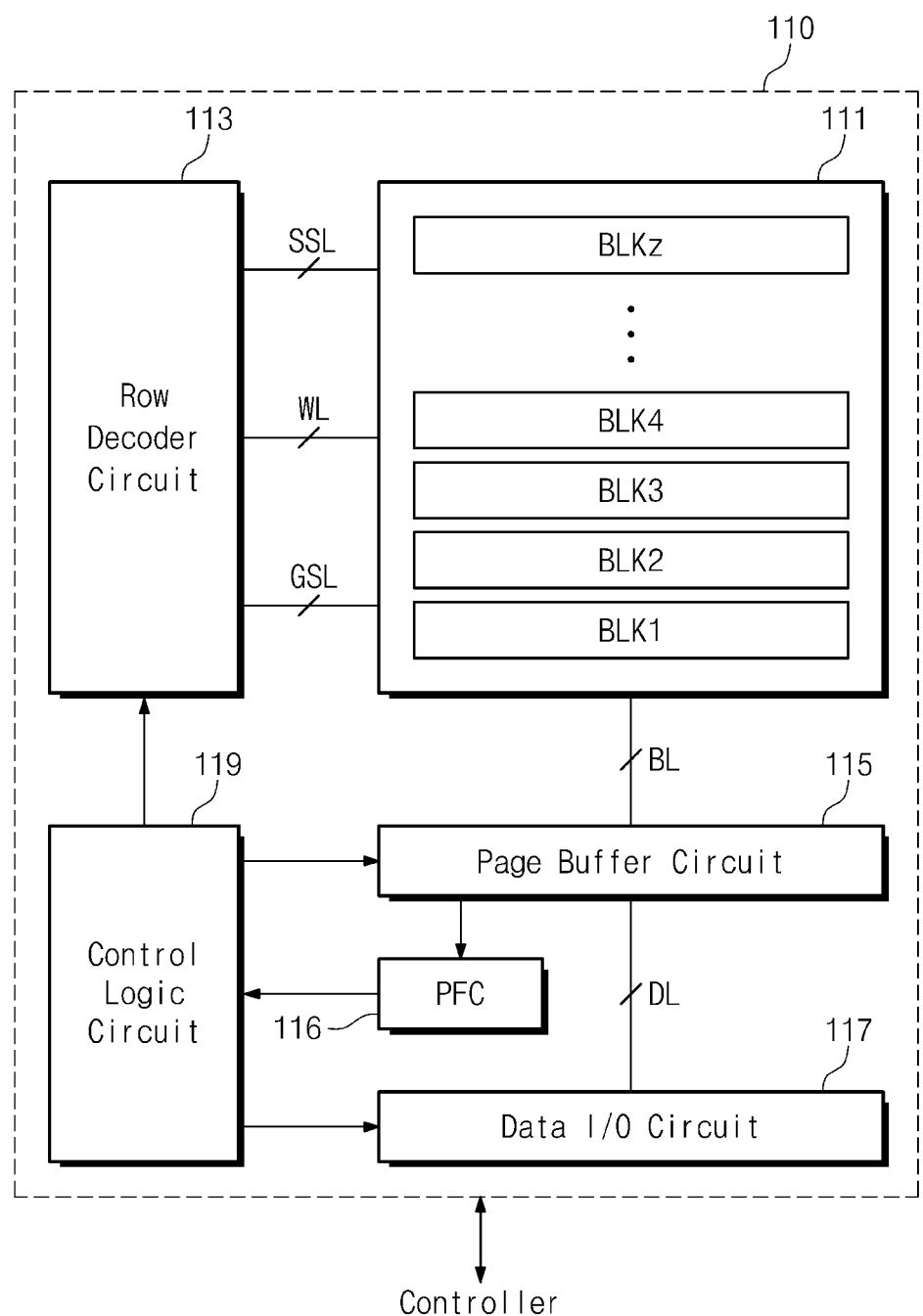
FIG. 1 illustrates a block diagram of a nonvolatile memory device according to an embodiment of the inventive concept.

FIG. 1 illustrates a block diagram of a nonvolatile memory device 110 according to an embodiment of the inventive concept. Referring to FIG. 1, the nonvolatile memory device 110 includes a memory cell array 111, a row decoder circuit 113, a page buffer circuit 115, a pass/fail check circuit PFC 116, a data input/output circuit 117, and a control logic circuit 119.

The memory cell array 111 may include a plurality of memory blocks BLK1 to BLKz. Each of the memory blocks BLK1 to BLKz may include a plurality of memory cells. Each of the memory blocks BLK1 to BLKz may be connected to the row decoder circuit 113 through at least one string selection line SSL, a plurality of word lines WL, and at least one ground selection line GSL. Each of the memory blocks BLK1 to BLKz may be connected to the page buffer circuit 115 through a plurality of bit lines BL. The memory blocks BLK1 to BLKz may be connected in common to the plurality of bit lines BL. Memory cells in the memory blocks BLK1 to BLKz may have the same structure.

In an embodiment, each of the memory blocks BLK1 to BLKz may be a unit of an erase operation. The memory cells in the memory cell array 111 may be erased by the memory block. The memory cells in a memory block may be erased at the same time. In other embodiments, each memory block may be divided into a plurality of sub-blocks, and erasing may be done by units of sub-block.

In an embodiment, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

In an embodiment, each memory block may include a plurality of physical pages, each of which includes a plurality of memory cells. A physical page may refer to a program unit. Memory cells of a physical page may be simultaneously programmed A physical page may include two or more logical pages. Bits to be programmed in memory cells of a physical page may constitute a logical page. First bits to be programmed in memory cells of a physical page may constitute a first logical page. K-th bits (K being a positive integer) to be programmed in the memory cells of the physical page may constitute a k-th logical page.

The row decoder circuit 113 may be connected to the memory cell array 111 through the at least one ground selection line GSL, the plurality of word lines WL, and the at least one string selection line SSL. The row decoder circuit 113 may operate in response to control of the control logic circuit 119. The row decoder circuit 113 may decode an address received from a controller through an input/output channel and may control voltages to be applied to the at least one string selection line SSL, the word lines WL, and the at least on ground selection line GSL based on the decoded address.

For example, during a program operation, the row decoder circuit 113 may apply a program voltage to a selected word line in a memory block selected by an address and a pass voltage to unselected word lines in the selected memory block. During a read operation, the row decoder circuit 113 may apply a selection read voltage to a selected word line in a memory block selected by an address and a non-selection read voltage to unselected word lines in the selected memory block. During an erase operation, the row decoder circuit 113 may apply an erase voltage (e.g., a ground voltage or a low voltage of which the level is similar to that of the ground voltage) to word lines in a memory block selected by an address.

The page buffer circuit 115 may be connected to the memory cell array 111 through the plurality of bit lines BL. The page buffer circuit 115 may be connected to the data input/output circuit 117 through a plurality of data lines DL. The page buffer circuit 115 may operate in response to control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation or a verification read operation, the page buffer circuit 115 may sense voltages on the bit lines BL and may store the sensed results. For example, the page buffer circuit 115 may function as a sense amplifier.

After a verification read operation, the pass/fail check circuit PFC 116 may receive the sensed results from the page buffer circuit 115. The pass/fail check circuit PFC 116 may determine the state of a programming as either a pass or a fail based on the received sensed results. For example, during a program verification read operation, the page buffer circuit 115 may count the number of on-cells. When the number of on-cells is greater than or equal to a threshold value, the pass/fail check circuit PFC 116 may determine a fail. When the number of on-cells is smaller than the threshold value, the pass/fail check circuit PFC 116 may determine a pass. For example, during an erase verification read operation, the pass/fail check circuit PFC 116 may count the number of off-cells. When the number of off-cells is greater than or equal to a threshold value, the pass/fail check circuit PFC 116 may determine a fail. When the number of on-cells is smaller than the threshold value, the pass/fail check circuit PFC 116 may determine a pass. The pass/fail determination result may be transferred to the control logic circuit 119.

The data input/output circuit 117 may be connected to the page buffer circuit 115 through the plurality of data lines DL. The data input/output circuit 117 may output data, which is read by the page buffer circuit 115, to the controller through an input/output channel and may transfer data, which is received from the controller through the input/output channel, to the page buffer circuit 115.

The control logic circuit 119 may receive a command from the controller through the input/output channel and may receive a control signal therefrom through a control channel The control logic circuit 119 may receive a command, which is received through the input/output channel, in response to the control signal, may route an address, which is received through the input/output channel, to the row decoder circuit 113, and may route data, which is received through the input/output channel, to the data input/output circuit 117. The control logic circuit 119 may decode the received command and may control the nonvolatile memory device 110 based on the decoded command.

In an embodiment, during a read operation, the control logic circuit 119 may generate a data strobe signal DQS based on a read enable signal/RE received from the controller through the control channel The data strobe signal DQS thus generated may be outputted to the controller through the control channel. During a program operation, the control logic circuit 119 may receive the data strobe signal DQS from the controller through the control channel Under control of the control logic circuit 119, a program operation, an erase operation, and a read operation may be performed with respect to memory cells of each memory block. The program operation may include a plurality of program loops. A program loop may be repeated until the program operation is determined as being a pass.

Each program loop may include a program section and a verification section. In the program section, the page buffer circuit 115 may apply voltages to bit lines BL based on data to be programmed For example, a ground voltage or a low voltage of which the level is similar to that of the ground voltage may be applied to a bit line corresponding to a memory cell of which the threshold voltage needs to increase, and a power supply voltage or a positive voltage of which the level is similar to that of the power supply voltage may be applied to a memory cell (e.g., a memory cell to be program inhibited) of which the threshold voltage needs not increase. The row decoder circuit 113 may apply a program voltage to a word line connected to selected memory cells and may apply a pass voltage to remaining word lines. In the verification section, a result of a program operation performed in the program section may be verified. The verification section may include a verification read operation and a pass/fail determination operation. During the verification read operation, the page buffer circuit 115 may apply a power supply voltage or a positive voltage, of which the level is similar to that of the power supply voltage, to the bit lines BL or bit lines corresponding to memory cells to be verified. The row decoder circuit 113 may apply a verification voltage to a word line connected to the memory cells to be verified and may apply read pass voltages to the remaining word lines, respectively. The result of the verification read operation may be sensed by the page buffer circuit 115, and the sensed result may be transferred to the pass/fail check circuit PFC 116. During the pass/fail determination operation, the pass/fail check circuit PFC may determine a pass or a fail of the programming based on the result of the verification read operation.

A read operation may be similar in operation to a verification read operation. During the read operation, the page buffer circuit 115 may apply a power supply voltage or a positive voltage, of which the level is similar to that of the power supply voltage, to the bit lines BL or bit lines corresponding to memory cells to be verified. The row decoder circuit 113 may apply a read voltage to a word line connected to memory cells to be read and may apply read pass voltages to remaining word lines. The result of the read operation may be sensed by the page buffer circuit 115 and may be outputted through the data input/output circuit 117.

An erase operation may include a plurality of erase loops. The erase loop may be repeated until the erase operation is determined as being a pass. Each erase loop may include an erase section and a verification section. During the erase section, the row decoder circuit 113 may apply a ground voltage or a low voltage, of which the level is similar to that of the ground voltage, to word lines connected to selected memory cells. An erase voltage may be applied to channels of the selected memory cells through a substrate. During the verification section, the result of the erase operation performed in the erase section result may be verified. The verification section may include a verification read operation and a pass/fail determination operation. During the verification read operation, the page buffer circuit 115 may apply a power supply voltage or a positive voltage, of which the level is similar to that of the power supply voltage, to the bit lines BL or bit lines corresponding to memory cells to be verified. The row decoder circuit 113 may apply an erase verification voltage to word lines connected to memory cells to be verified. The result of the verification read operation may be sensed by the page buffer circuit 115, and the sensed result may be transferred to the pass/fail check circuit PFC 116. During the pass/fail determination operation, the pass/fail check circuit PFC 116 may determine whether a pass or a fail of the erase operation based on the result of the verification read operation.

FIG. 2 illustrates a circuit diagram of a memory block BLKa according to an embodiment of the inventive concept. Referring to FIG. 2, a memory block BLKa includes a plurality of cell strings CS11 to CS21 and CS12 to CS22. The plurality of cell strings CS11 to CS21 and CS12 to CS22 may be arranged along a row direction and a column direction to constitute rows and columns For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may include a plurality of cell transistors. In each cell string, the cell transistors may include a ground selection transistor GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Each cell transistor may be a charge trap type cell transistor of which the threshold voltage changes according to the amount of charges trapped in an insulating layer thereof.

Sources of lowermost ground selection transistors GST may be connected in common to a common source line CSL.

Control gates of the ground selection transistors of the cell strings CS11 and CS12 in the first row may be connected in common to a ground selection line GSL1, and control gates of the ground selection transistors of the cell strings CS21 and CS22 in the second row may be connected in common to a ground selection line GSL2. That is, cell strings in different rows may be connected to different ground selection lines.

In an embodiment, the memory block BLKa may be modified or changed such that ground selection transistors belonging to the same row and placed at different heights are connected to different ground selection lines. In an embodiment, the memory block BLKa may be modified or changed such that ground selection lines which are connected to ground selection transistors belonging to different rows and placed at the same height are interconnected and controlled in common. In an embodiment, the memory block BLKa may be modified or changed such that ground selection lines which are connected to ground selection transistors are interconnected and controlled in common.

Connected in common to a word line are control gates of memory cells that are placed at the same height (or order) from the substrate (or the ground selection transistors GST). Connected to different word lines WL1 to WL6 are control gates of memory cells that are placed at different heights (or orders). For example, the memory cells MC1 may be commonly connected to a word line WL1. The memory cells MC2 may be connected in common to the word line WL2. The memory cells MC3 may be connected in common to the word line WL3. The memory cells MC4 may be connected in common to the word line WL4. The memory cells MC5 may be connected in common to the word line WL5. The memory cells MC6 may be connected in common to the word line WL6.

Of the first string selection transistors SSTa of the cell strings CS11 to CS21 and CS12 to CS22 which have the same height (or order), control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

Of the second string selection transistors SSTb of the cell strings CS11 to CS21 and CS12 to CS22 which have the same height (or order), control gates of the second string selection transistors SSTb in different rows may be connected to the different string selection lines SSL1b and SSL2b. For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

That is, cell strings in different rows may be connected to different string selection lines. String selection transistors of cell strings which have the same height (or order) and belong to the same row may be connected to the same string selection line. String selection transistors of cell strings which have different heights (or orders) and belong to the same row may be connected to different string selection lines.

In an embodiment, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11 to CS21 and CS12 to CS22 may be connected to different bit lines BL1 and BL2, respectively. For example, the string selection transistors SSTb of the cell strings CS11 and CS21 in the first column may be connected in common to the bit line BL1. The string selection transistors SSTb of the cell strings CS12 and CS22 in the second column may be connected in common to the bit line BL2.

The memory block BLKa may be characterized in that memory cells placed at the same height from the substrate share a word line. Different memory blocks may not share word lines. For example, a memory cell of a first memory block placed at a first height may share a word line with another memory cell of the first memory block placed at the first height. The memory cell of the first memory block placed at the first height may not share a word line with a memory cell of a second memory block placed at the first height. A sub-block may be a portion of the memory block BLKa.

The cell strings CS11 and CS12 may constitute a first plane. The cell strings CS21 and CS22 may constitute a second plane.

In the memory block BLKa, memory cells of each plane placed at the same height may compose a physical page. The physical page may refer to a unit by which the memory cells MC1 to MC6 are written and read. For example, one plane of the memory block BLKa may be selected by the string selection lines SSL1a, SSL1b, SSL2a, and SSL2b. The cell strings CS11 and CS12 in a first plane may be connected to the bit lines BL1 and BL2 when a turn-on voltage is supplied to the string selection lines SSL1a and SSL1b and a turn-off voltage is supplied to the string selection lines SSL2a and SSL2b. That is, the first plane may be selected. The cell strings CS21 and CS22 in a second plane may be connected to the bit lines BL1 and BL2 when the turn-on voltage is supplied to the string selection lines SSL2a and SSL2b and the turn-off voltage is supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be applied to remaining word lines WL1 and WL3 to WL6. That is, a physical page which corresponds to the second word line WL2 of the second plane may be selected by adjusting voltages of the string selection lines SSL1a, SSL1b, SSL2a, and SSL2b and the word lines WL1 to WL6. A write or read operation may be performed with respect to memory cells MC2 in the selected physical page.

For example, two or more bits may be written at each memory cell MC. Logical pages may be composed of bits which are written at memory cells belonging to a physical page. First bits which are written at memory cells belonging to the physical page may constitute a first logical page. N-th bits which are written at memory cells belonging to the physical page may constitute an N-th logical page. A logical page may refer to a unit by which data is accessed. When a read operation is performed with respect to a physical page, data may be accessed by the logical page.

In the memory block BLKa, the memory cells MC1 to MC6 may be erased by the memory block or by the sub-block. When an erase operation is performed by the memory block, all memory cells MC in the memory block BLKa may be simultaneously erased according to an erase request (e.g., an erase request from an external controller). When an erase operation is performed by the sub-block, a portion of memory cells MC in the memory block BLKa may be simultaneously erased according to an erase request (e.g., an erase request from an external controller), and the others thereof may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

The memory block BLKa shown in FIG. 2 is an example. In other embodiments, the number of rows of cell strings may increase or decrease for example. As the number of rows of cell strings is changed, the number of string or ground selection lines and the number of cell strings connected to a bit line may also be changed.

The number of columns of cell strings may increase or decrease. As the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In an embodiment, memory cells MC in a physical page may correspond to at least three logical pages. For example, k bits (k being an integer of 2 or more) may be programmed in a memory cell MC. In memory cells MC of a physical page, k bits programmed in each memory cell MC may form k logical pages respectively.

As described above, the memory block BLKa may include a three-dimensional memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present inventive concept, the 3D memory array includes vertical NAND strings (or cell strings) that are vertically oriented such that at least one memory cell is located over another memory cell. The at least one memory cell MC may comprise a charge trap layer. Each vertical NAND string may further include at least one selection transistor placed over the memory cells MC. The at least one selection transistor may have the same structure as the memory cells MC and may be formed uniformly with the memory cells MC.

A composition where the 3D memory array is constructed in a plurality of levels and word lines or bit lines between the levels are shared may be disclosed in U.S. Pat. Nos. 7,679,133, 8,553,466, 8,654,587 and 8,559,235, and U.S. Patent-Publication No. US2011/0233648. The disclosed patents are incorporated by references in the present invention.

Figure 3:
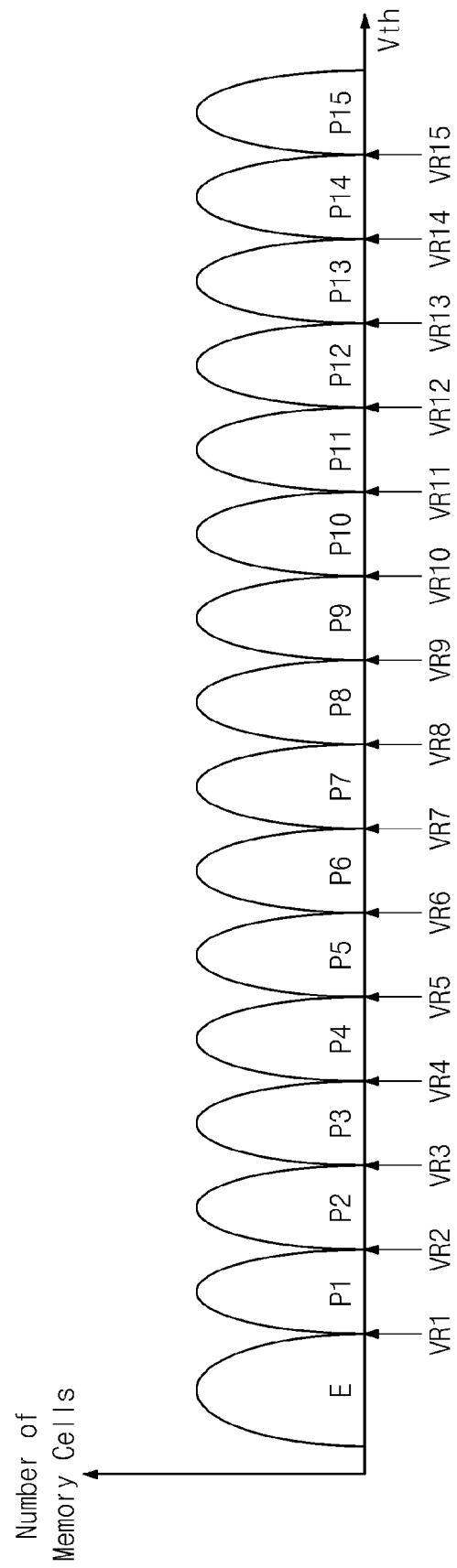
FIG. 3 illustrates a diagram of threshold voltages of memory cells MC and logical states thereof when the memory cells MC are programmed.

FIG. 3 illustrates a diagram of threshold voltages of memory cells MC and logical states thereof when the memory cells MC are programmed. In FIG. 3, the abscissa represents a threshold voltage Vth, and the ordinate represents the number of memory cells MC. In this embodiment described as follows, it may be assumed that 4 bits are programmed in a memory cell. However, in other embodiments N (N being a positive integer) bits may be programmed in a memory cell.

Referring to FIGS. 2 and 3, sixteen different patterns corresponding to $2^4$ (or $2^N$) may be formed according to four (or N) bits to be programmed in each memory cell. The sixteen different patterns may be respectively mapped to states including an erase state E and first to fifteenth program states P1 to P15. Each of the erase state E and the first to fifteenth program states P1 to P15 may be distinguished according to a threshold voltage Vth of each memory cell MC.

For example, memory cells MC of which the threshold voltages are lower than a first read voltage VR1 may be determined as having the erase state E. Memory cells MC of which the threshold voltages are higher than or equal to the first read voltage VR1 and lower than a second voltage VR2 may be determined as being in the program state P1. Likewise, memory cells MC of which the threshold voltages are higher than or equal to the k-th read voltage VRk (k being an integer which is greater than or equal to 1 and smaller than 15) and lower than (k+1)-th read voltage VRk+1 may be determined as being in the program state Pk. Memory cells MC of which the threshold voltages are higher than the 15-th read voltage VR15 may be determined as being in the program state P15.

The programmed memory cells MC may experience a retention issue. The retention issue may mean that threshold voltages of programmed memory cells MC decrease with the lapse of time. A retention issue occurring at memory cells will be described with reference to FIG. 4.

Figure 4:
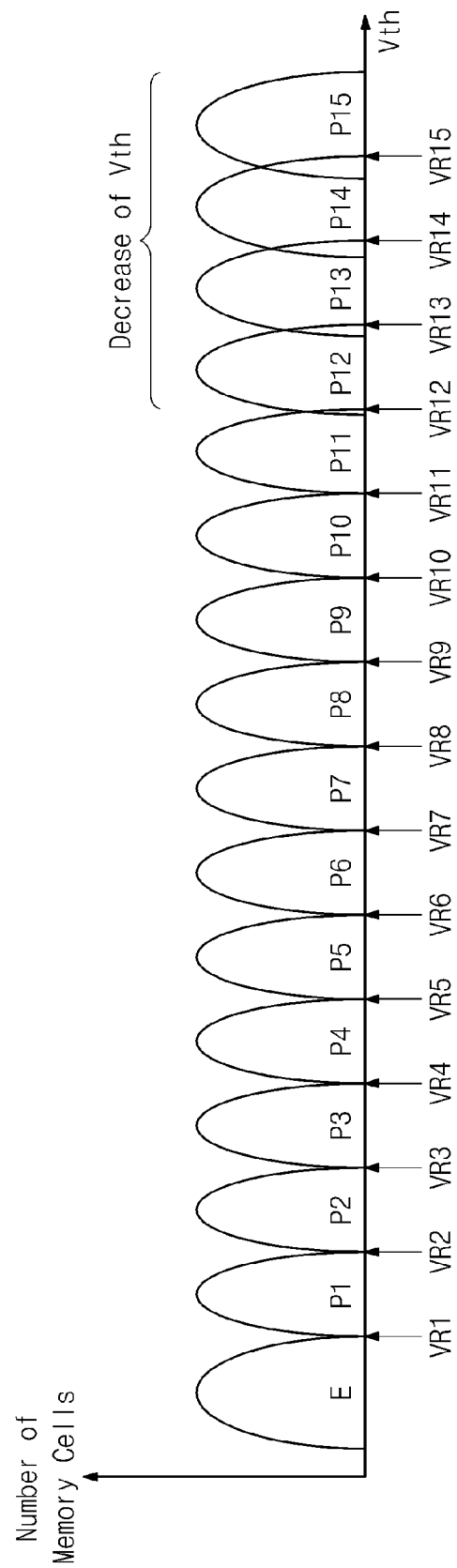
FIG. 4 illustrates a diagram of a change in the threshold voltage distributions of FIG. 3 due to a retention issue.

FIG. 4 illustrates a diagram of a change in the threshold voltage distributions of FIG. 3 due to a retention issue. In FIG. 4, the abscissa represents a threshold voltage Vth, and the ordinate represents the number of memory cells MC. When compared to FIG. 3, FIG. 4 shows that a decrease of threshold voltages Vth is focused on twelfth to fifteenth program states P12 to P15.

In an embodiment, memory cells MC may be programmed by trapping electrons in charge trap layers thereof. As the amount of trapped electrons becomes greater, the threshold voltages of memory cells MC become higher. That is, as the threshold voltage of a memory cell increases, the amount of electrons trapped therein increase. As the amount of electrons trapped in the memory cell increases, the amount of electrons leaked therefrom may also increase. For this reason, compared to the first to eleventh program states P1 to P11, the retention issue may be more severe in memory cells MC of the twelfth to fifteenth program states P12 to P15.

The retention issue may make threshold voltages of memory cells MC become lower than a corresponding read voltage, thereby causing a read error. Read errors about the twelfth to fifteenth program states P12 to P15 may be more in number than those about the first to eleventh program states P1 to P11 because of the retention issue.

Figure 5:
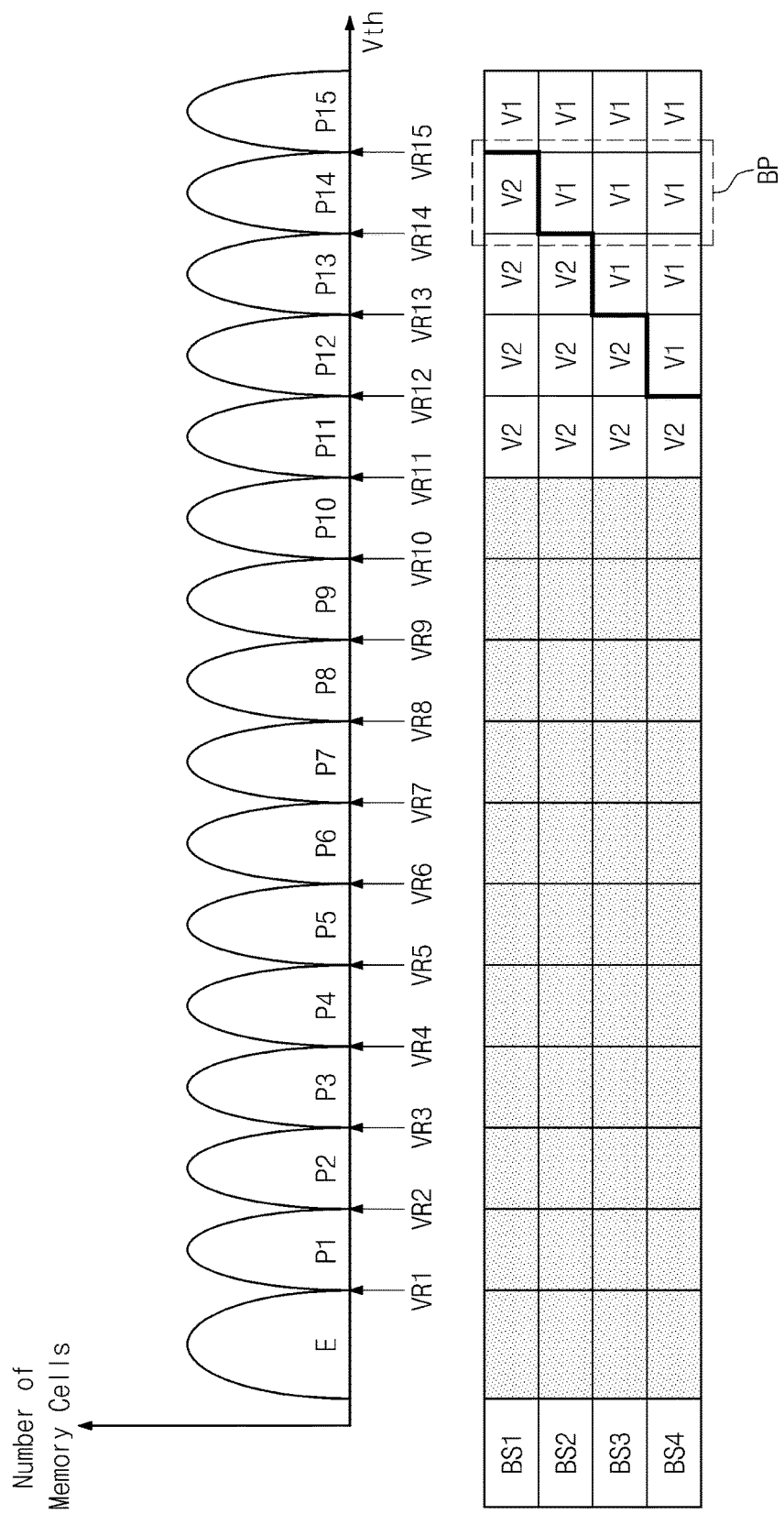
FIG. 5 illustrates an example in which memory cells are programmed according to an embodiment of the inventive concept.

FIG. 5 illustrates an example in which memory cells MC are programmed according to an embodiment of the inventive concept. In FIG. 5, the abscissa represents a threshold voltage Vth, and the ordinate represents the number of memory cells MC.

Referring to FIGS. 2 and 5, four (or N) bits to be programmed in a memory cell may form a bit pattern BP. For example, sixteen states including an erase state E and first to fifteenth program states P1 to P15 may correspond to sixteen different bit patterns BP.

Values of a first bit, which vary according to the erase state E and the first to fifteenth program states P1 to P15, from among four (or N) bits to be programmed in each memory cell may constitute a first bit stream BS1. Values of a k-th bit (k being a positive integer between 1 and 4 or N), which vary according to the erase state E and the first to fifteenth program states P1 to P15, from among four (or N) bits to be programmed in each memory cell may constitute a k-th bit stream BSk.

Bit patterns BP associated with the erase state E and the first to tenth program states P1 to P10 are not associated with the technical feature of the inventive concept disclosed with respect to FIG. 5, and thus description thereof may be omitted. A first value V1 represented in bit patterns BP of the eleventh to fifteenth program states P11 to P15 may have a value of "1" or "0", and a second value V2 may be different from the first value V1 and may have a value of "0" or "1".

The most adjacent four (or N) read voltages including the fifteenth read voltage VR15 of the highest level and the fourteenth read voltage VR14 of a second highest level, that is, the twelfth to fifteenth read voltages VR12 to VR15 may be respectively used for different bits of the bit pattern BP. For example, the fifteenth read voltage VR15 may be used to determine whether a first bit of a bit pattern BP has any one of the first value V1 and the second value V2. The fourteenth read voltage VR14 may be used to determine whether a second bit of the bit pattern BP has the first value V1 or the second value V2. The thirteenth read voltage VR13 may be used to determine whether a third bit of the bit pattern BP has the first value V1 or the second value V2. The twelfth read voltage VR12 may be used to determine whether a fourth bit of the bit pattern BP has the first value V1 or the second value V2.

In other words, each of the first to fourth bit streams BS1 to BS4 may be set to have a transition point at program states P11 to P15 associated with the most adjacent four (or N) read voltages VR12 to VR15 including the fourteenth read voltage VR14 of the second highest level. The transition point may indicate a point at which a value is changed from the second value V2 to the first value V1. The transition points between the program states P11 to P15 are indicated by the bold lines in the lower portion of FIG. 5.

First bits of bit patterns BP to be programmed in memory cells MC of a physical page may constitute a first logical page. K-th bits (k is a positive integer greater than or equal to 1 and smaller than or equal to 4 or N) of the bit patterns BP to be programmed in the memory cells MC of the physical page may constitute a k-th logical page. A controller of the nonvolatile memory device 110 (refer to FIG. 1) may detect and correct an error by the logical page. As illustrated in FIG. 5, when the twelfth to fifteenth read voltages VR12 to VR15 are used to distinguish different bits (or values) of a bit pattern BP, or each bit stream BS has a transition point at the program states P11 to P15 associated with the twelfth to fifteenth read voltages VR12 to VR15, read operations for determining the eleventh to fifteenth program states P11 to P15 may be distributed in first to fourth (or N-th) logical pages. That is, when the nonvolatile memory device 110 is implemented to perform a read operation based on a method illustrated in FIG. 5, read operations in which the probability of error occurrence is high may be distributed through logical pages, thereby preventing a burst error. This may mean that reliability of the nonvolatile memory device 110 is improved.

To perform a read operation based on a method illustrated in FIG. 5, the nonvolatile memory device 110 may be configured to perform a program operation which fits to the method illustrated in FIG. 5. The programming of the nonvolatile memory device 100 will be described with reference to FIG. 6.

Figure 6:
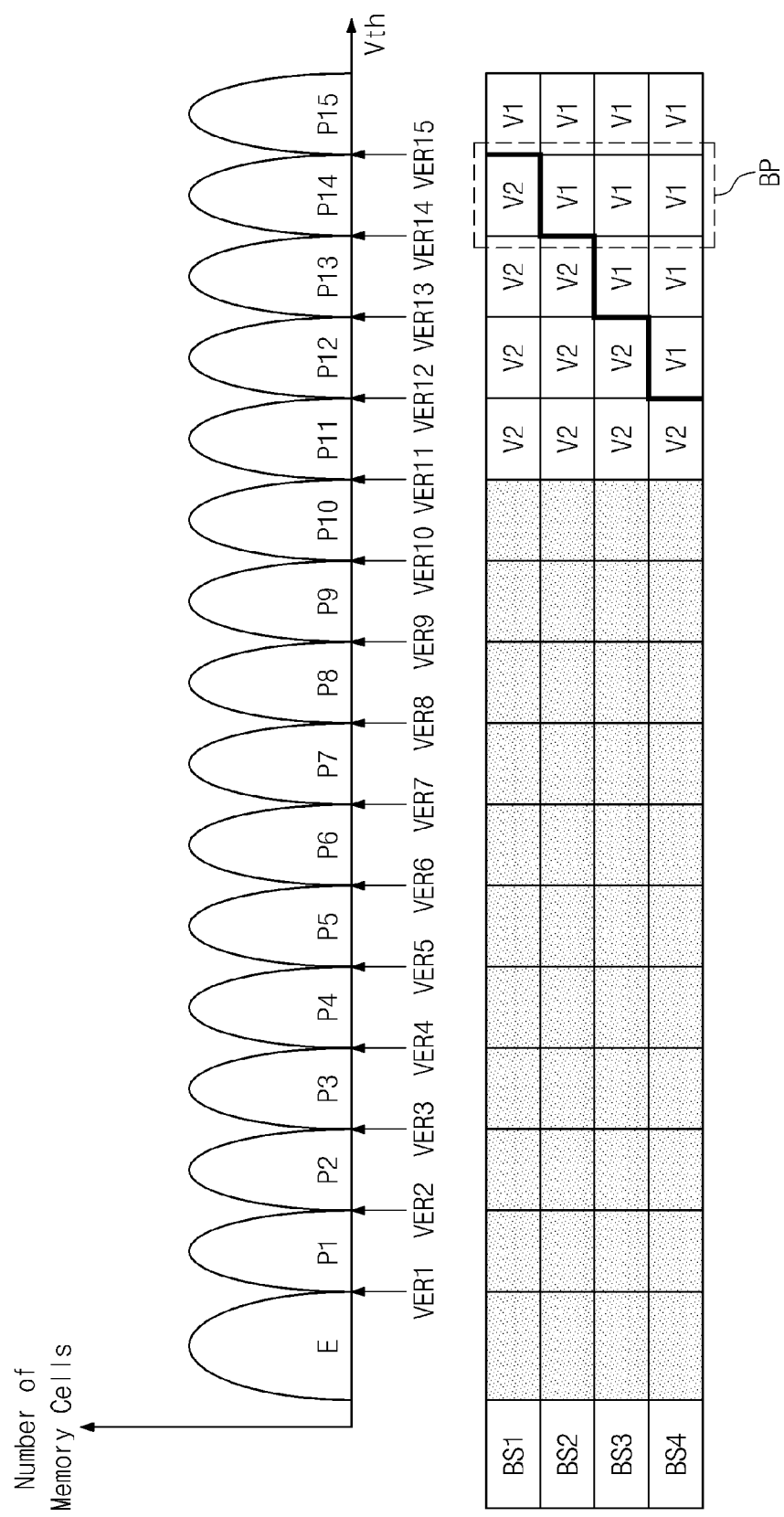
FIG. 6 illustrates threshold voltage distributions and bit streams in association with a program operation.

FIG. 6 illustrates threshold voltage distributions and bit streams BS in association with a program operation. In a graph at the top of FIG. 6, the abscissa represents a voltage Vth, and the ordinate represents the number of memory cells MC. A table at the bottom of FIG. 6 shows bit patterns BP and bit streams BS associated with an erase state E and first to fifteenth program states P1 to P15.

During a program operation, memory cells MC to be programmed to the first program state P1 may be controlled to have a threshold voltage Vth higher than a first verification voltage VER1. During a program operation, memory cells MC to be programmed to the k-th program state Pk may be controlled to have a threshold voltage Vth higher than a k-th verification voltage VERk. That is, memory cells MC from among memory cells MC to be programmed to the k-th program state Pk which have a threshold voltage lower than the k-th verification voltage VERk may be programmed, and memory cells MC from among the memory cells MC to be programmed to the k-th program state Pk which have a threshold voltage Vth higher than the k-th verification voltage VERk may be program-inhibited.

The twelfth to fifteenth program states P12 to P15 associated with the twelfth to fifteenth verification voltages VER12 to VER15 may be verified while four (or N) verification voltages VER12 to VER15 including the fourteenth verification voltage VER14 of the second highest level and the fifteenth verification voltage VER15 of the highest voltage are applied. Each bit stream BS may be set to have one transition point or no transition point in a threshold voltage zone defined by the twelfth to fifteenth program states P12 to P15 to be verified. For example, in FIG. 6, each of the first to third bit streams BS1 to BS3 may have one transition point within the threshold voltage zone defined by the twelfth to fifteenth program states P12 to P15, and the fourth bit stream BS4 may not have a transition point within the threshold voltage zone defined by the twelfth to fifteenth program states P12 to P15. The nonvolatile memory device 110 may program data received from an external device in memory cells MC based on a method illustrated in FIG. 6.

In FIG. 5, an embodiment of the inventive concept is exemplified as program states associated with the twelfth to fifteenth read voltages VR12 to VR15 are the eleventh to fifteenth program states P11 to P15. In contrast, in FIG. 6, an embodiment of the inventive concept is exemplified as program states associated with the twelfth to fifteenth verification voltages VER12 to VER15 are the twelfth to fifteenth program states P12 to P15. This difference may occur due to a difference between characteristics of program and read operations. For example, a read voltage may be used to distinguish between a memory cell, which has a threshold voltage lower than the read voltage, and a memory cell which has a threshold voltage higher than the read voltage. That is, the read voltage may be associated with both a program state of a memory cell(s) of which the threshold voltage is lower than the read voltage and a program state of a memory cell(s) of which the threshold voltage is higher than the read voltage. In contrast, a verification voltage may be used to make a threshold voltage of a memory cell become higher than a threshold voltage. That is, the verification voltage may be associated with a program state of a memory cell(s) of which the threshold voltage is higher than the verification voltage.

Figure 7:
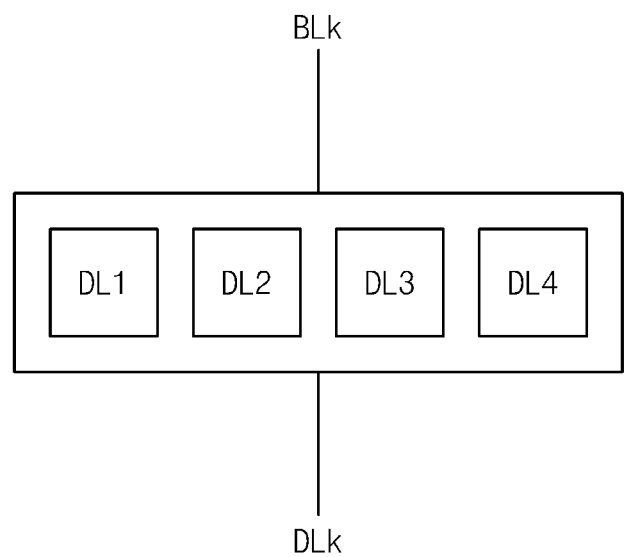
FIG. 7 illustrates a block diagram of a page buffer circuit according to an embodiment of the inventive concept.

FIG. 7 illustrates a block diagram of a page buffer circuit 115 according to an exemplary embodiment of the inventive concept. Referring to FIGS. 1 and 7, the page buffer circuit 115 may include a plurality of page buffers corresponding to a plurality of bit lines BL. In an embodiment, a page buffer corresponding to a bit line BLk is illustrated in FIG. 7.

The page buffer includes first to fourth data latches DL1 to DL4. The first to fourth data latches DL1 to DL4 may be configured to store a bit pattern BP to be programmed in a memory cell or a bit pattern BP read from a memory cell. When N bits are stored in a memory cell, the page buffer may include N data latches.

Figure 8:
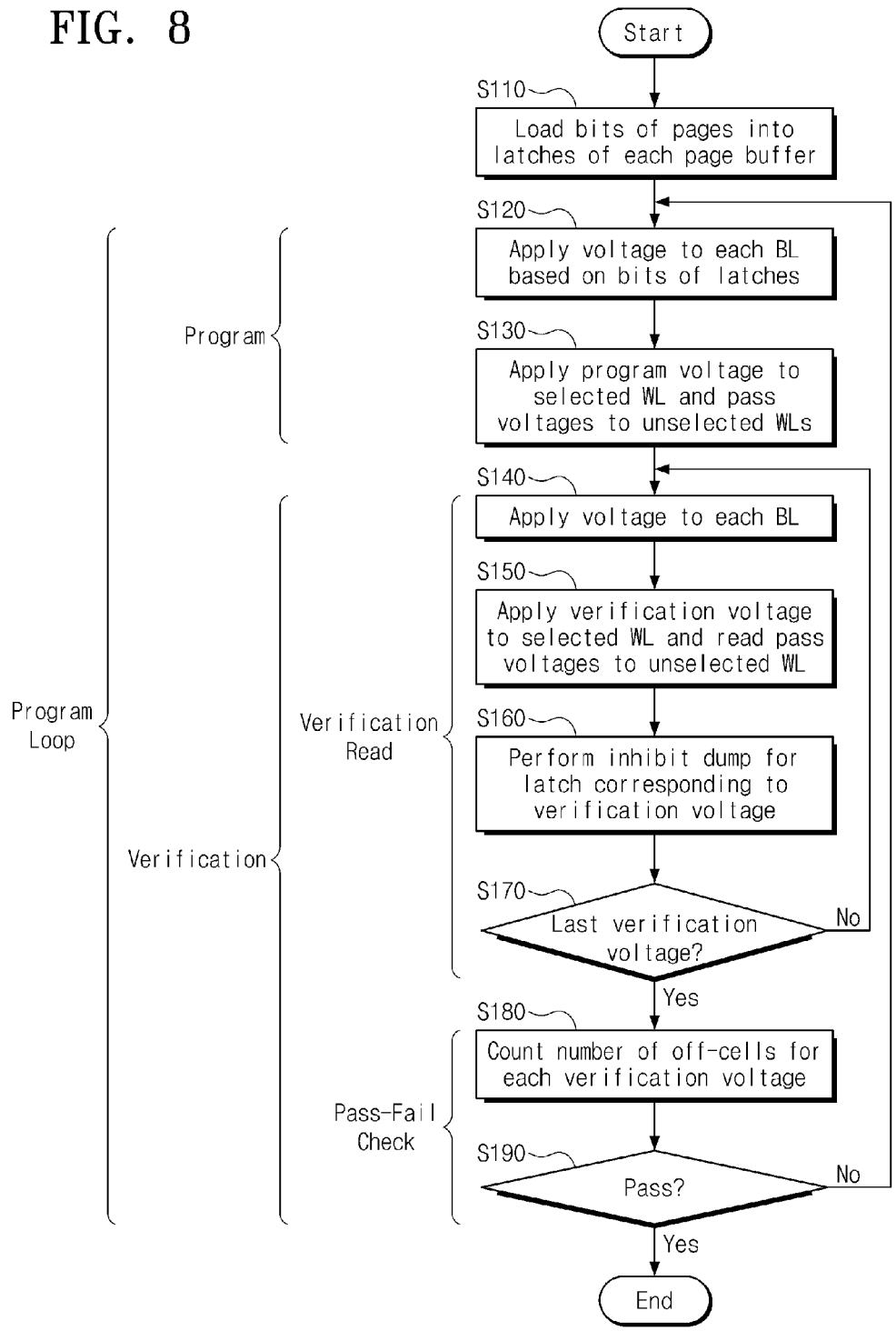
FIG. 8 illustrates a flow chart of a method in which a nonvolatile memory device performs a program operation, according to an embodiment of the inventive concept.

FIG. 8 illustrates a flow chart of a method in which a nonvolatile memory device 110 performs a program operation, according to an embodiment of the inventive concept. Control logic circuit 119 may control the circuits of nonvolatile memory device 110 during the program operation. Referring to. FIGS. 1, 2, 7, and 8, in step S110, the nonvolatile memory device 110 loads bits of pages into latches of page buffers within page buffer circuit 115. Bits of pages to be written at memory cells MC may be received from the controller. The nonvolatile memory device 110 may load bits of a k-th page into k-th data latches DLk of page buffers within page buffer circuit 115. A bit pattern BP to be programmed in a corresponding memory cell may be loaded into data latches DL1 to D4 of each page buffer.

Step S110 may correspond to an operation in which data to be programmed is set before a program loop begins. In steps S120 to S190, a program loop may be repeated.

Steps 120 and 130 may correspond to a program section of each program loop. In step S120, the nonvolatile memory device 110 applies voltages to bit lines based on bits of latches of page buffers within page buffer circuit 115. For example, when a bit pattern BP loaded into a page buffer within page buffer circuit 115 indicates programming, the page buffer may apply a ground voltage or a low voltage of which the level is similar to that of the ground voltage, to a corresponding bit line. When a bit pattern BP loaded into a page buffer indicates program-inhibition, the buffer may apply a power supply voltage or a positive voltage of which the level is similar to the power supply voltage, to a corresponding bit line. In an embodiment, a bit pattern which indicates program-inhibition may be the same as a bit pattern corresponding to an erase state E. In an embodiment, voltages applied to corresponding bit lines through page buffers which correspond to memory cells to be program-inhibited may be different from each other. Voltages applied to corresponding bit lines through page buffers which correspond to memory cells to be programmed may be different from each other.

In step S130, the nonvolatile memory device 110 applies a program voltage to a selected word line and a pass voltage to unselected word lines. For example, the row decoder circuit 113 may apply a turn-on voltage to selected string selection lines of the selected memory block BLKa and a turn-off voltage to unselected string selection lines. The row decoder circuit 113 may apply a turn-off voltage to ground selection lines GSL1 and GSL2 of the selected memory block BLKa. The row decoder circuit 113 may apply the program voltage to the selected word line and the pass voltage to the unselected word lines. The pass voltage may be a high voltage sufficient to turn on memory cells of the highest program state P15. The program voltage may be a voltage higher than the pass voltage.

After programming is performed in the program section of steps S120 and S130, threshold voltages of memory cells MC defined by bit lines corresponding to programming and the selected word line may increase, and threshold voltages of remaining memory cells MC may be maintained.

Steps S140 to S170 may correspond to a verification read operation of a verification section in each program loop. The verification read operation may be repeatedly performed with verification voltages VER1 to VER15 sequentially selected.

In step S140, the nonvolatile memory device 110 applies a voltage to each bit line. For example, page buffers of the page buffer circuit 115 may apply a power supply voltage or a positive voltage of which the level is similar to that of the power supply voltage, to all the bit lines BL. As another example, page buffers of the page buffer circuit 115 may apply a power supply voltage or a positive voltage of which the level is similar to that of the power supply voltage, to bit lines associated with memory cells to be verified and may apply a ground voltage or a low voltage of which the level is lower than that of the ground voltage, to the remaining bit lines. For example, when the verification read operation is performed using the k-th verification voltage VERk, page buffers each of which stores a bit pattern BP corresponding to the k-th program state Pk may apply a power supply voltage or a positive voltage of which the level is similar to that of the power supply voltage, to the corresponding bit lines, and remaining page buffers may apply a ground voltage or a low voltage of which the level is lower than that of the ground voltage, to the corresponding bit lines.

In step S150, the nonvolatile memory device 110 applies a verification voltage to a selected word line and a read pass voltage to unselected word lines. For example, the row decoder circuit 113 may apply a turn-on voltage to selected string selection lines of the selected memory block BLKa and a turn-off voltage to unselected string selection lines thereof. The row decoder circuit 113 may apply the turn-on voltage to a selected ground selection line of the selected memory block BLKa and the turn-off voltage to an unselected ground selection line thereof. The row decoder circuit 113 may apply the verification voltage to the selected word line and the read pass voltage to the unselected word lines. The read pass voltage may be a high voltage sufficient to turn on memory cells of the highest program state P15.

In step S160, the nonvolatile memory device 110 performs an inhibit dump operation. The nonvolatile memory device 110 may prohibit data from being dumped into a latch corresponding to the verification voltage. During the verification read, the nonvolatile memory device 110 may dump a read result, obtained using the verification voltage, into a page buffer within page buffer circuit 115 that stores a bit pattern BP corresponding to the verification voltage. For example, the nonvolatile memory device 110 may perform a verification read operation using the k-th verification voltage VERk, and may dump the verification read result into a page buffer which stores a bit pattern BP corresponding to the k-th program state Pk.

In the inhibit dump, from among page buffers each of which stores a bit pattern corresponding to a verification voltage, the nonvolatile memory device 110 updates latches of page buffers corresponding to off-cells turned off during the verification read operation using the verification voltage. This updating of latches of the page buffers corresponding to the off-cells is performed without changing latches of page buffers corresponding to on-cells turned on during the verification read operation. For example, page buffers corresponding to off-cells are updated to indicate program-inhibition, so that the corresponding off-cell is prohibited from further programming For example, the page buffers corresponding to the off-cells may be updated to store a bit pattern corresponding to the erase state E.

In step S170, it is determined by control logic circuit 119 whether a verification read operation has been performed using the last verification voltage. When there exists a verification voltage which has not yet been used for a verification read operation (No in step S170), the procedure proceeds to step S140 and a verification read operation using a corresponding verification voltage is performed. When all verification voltages have been used for the verification read operation (Yes in step S170), the procedure proceeds to step S180.

Steps S180 and S190 may correspond to a pass/fail check determination operation of the verification section in each program loop. In step S180, the nonvolatile memory device 110 counts the number of off-cells among cells read using each verification voltage. For example, the pass/fail check circuit PFC 116 counts the number of off-cells corresponding to each verification voltage.

In step S190, the pass/fail check circuit PFC 116 compares the number of off-cells corresponding to each verification voltage with a reference value. When the number of off-cells corresponding to each verification voltage is smaller than or equal to the reference value, a program state associated with each verification voltage may be determined to be a program pass (Yes in step S190). When the number of off-cells corresponding to each verification voltage is greater than the reference value, a program state associated with each verification voltage may be determined to be a program fail (No in step S190). When all the verification voltages or all the program states are determined to be program pass, the program operation may be ended. When at least one verification voltage or at least one program state is determined to be program fail, a program voltage may be increased, and the procedure proceeds to step S120 to begin another program loop.

In an embodiment, when at least one verification voltage or at least one program state is determined to be program pass, the verification read operation and the pass/fail determination operation associated with a corresponding verification voltage or a corresponding program state may be skipped in the following program loops.

Figure 9:
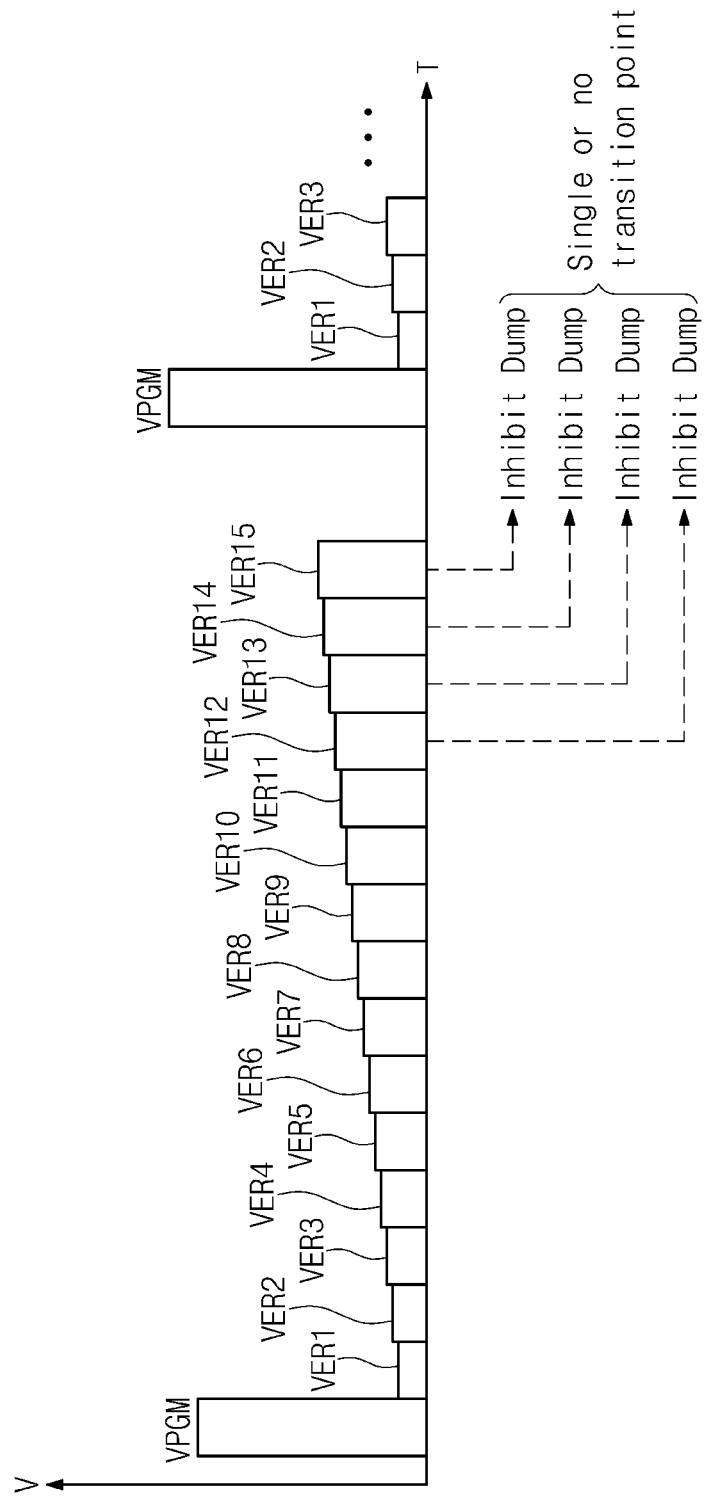
FIG. 9 illustrates an example in which a program operation is performed according to a program method of FIG. 8.

FIG. 9 illustrates an example in which a program operation is performed according to a program method of FIG. 8. In FIG. 9, the abscissa represents a time T, and the ordinate represents a voltage V applied to a selected word line.

Referring to FIGS. 1, 2, and 7 to 9, a program voltage VPGM is applied to a selected word line in a program section, and first to fifteenth verification voltages VER1 to VER15 are sequentially applied in a verification section. An embodiment of the inventive concept is exemplified in FIG. 9 as the first to fifteenth verification voltages VER1 to VER15 are applied in an ascending order. However, the first to fifteenth verification voltages VER1 to VER15 may be applied in a descending order or in an arbitrary order.

An inhibit dump (refer to step S160) is performed while the four (or N) verification voltages VER12 to VER15 including the fourteenth verification voltage VER14 of the second highest level and the fifteenth verification voltage VER15 of the highest level are applied. The inhibit dump may be performed with respect to four (or N) program states P12 to P15 corresponding to the four (or N) verification voltages VER12 to VER15. That is, page buffers which store bit patterns BP corresponding to the four (or N) program states P12 to P15 may be updated according to the verification read result. Each of bit streams corresponding to the four (or N) program states P12 to P15 may have a transition point. That is, while the most adjacent four (or N) verification voltages VER12 to VER15 are applied, the inhibit dump may be performed with respect to a portion of each bit stream having a transition point.

Figure 10:
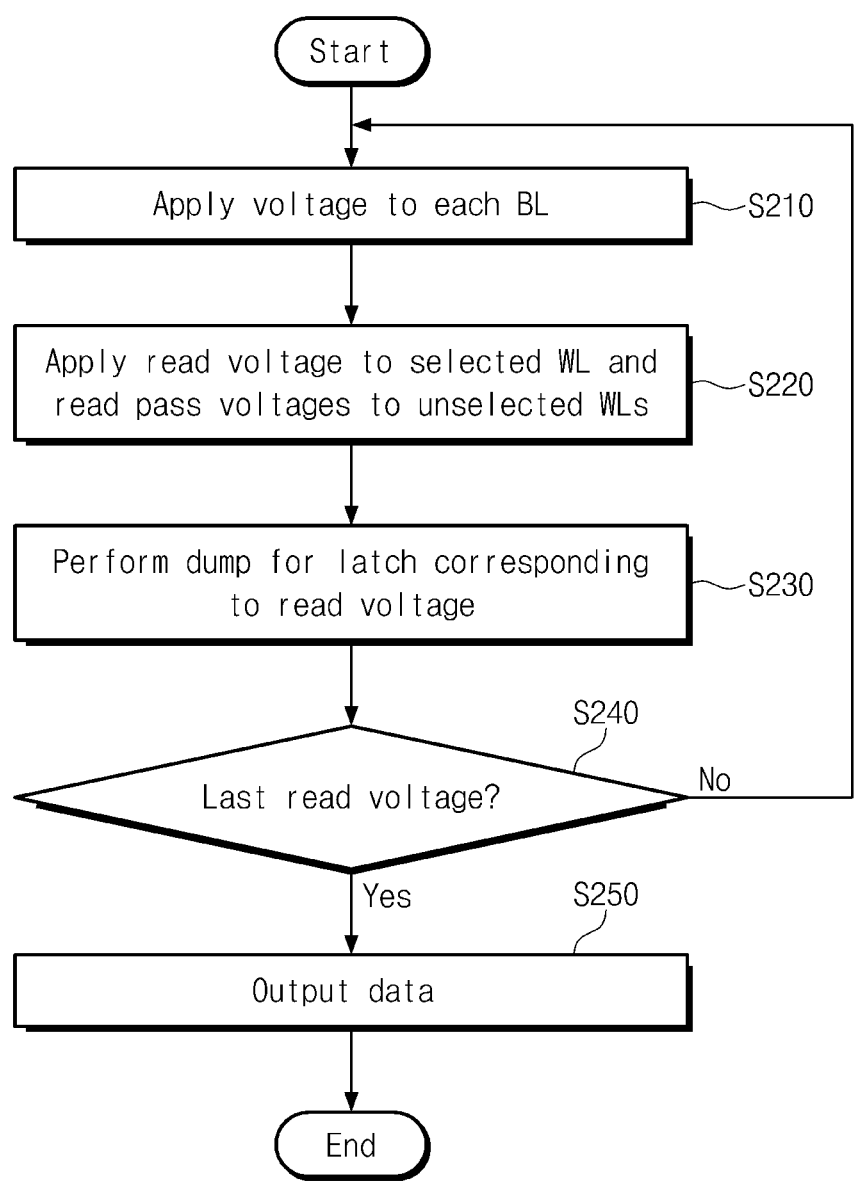
FIG. 10 illustrates a flow chart of a method in which a read operation of a nonvolatile memory device is performed, according to an embodiment of the inventive concept.

FIG. 10 illustrates a flow chart of a method in which a read operation of a nonvolatile memory device 110 is performed, according to an embodiment of the inventive concept. Referring to. FIGS. 1, 2, 7, and 10, in step S210, the nonvolatile memory device 110 applies a voltage to each bit line. For example, page buffers of the page buffer circuit 115 may apply a power supply voltage or a positive voltage of which the level is similar to that of the power supply voltage, to all bit lines. Levels of voltages applied to the bit lines may be different from each other.

In step S220, the nonvolatile memory device 110 applies a read voltage to a selected word line and a read pass voltage to unselected word lines. For example, the row decoder circuit 113 may apply a turn-on voltage to selected string selection lines of the selected memory block BLKa and a turn-off voltage to unselected string selection lines thereof. The row decoder circuit 113 may apply the turn-on voltage to a selected ground selection line of the selected memory block BLKa and the turn-off voltage to an unselected ground selection line thereof. The row decoder circuit 113 may apply the read voltage to the selected word line and the read pass voltage to the unselected word lines.

In step S230, the nonvolatile memory device 110 updates a read result by performing a dump operation with respect to a latch corresponding to the read voltage.

In step S240, it is determined by the control logic circuit 119 whether an immediately previously used read voltage corresponds to the last read voltage. For example, when there exists a read voltage which has not yet been used for a read operation (No in step S240), the procedure proceeds to step S210 and a read operation is performed from step S210 using a corresponding read voltage. When all the read voltages have been used for a read operation (Yes in step S240), the procedure proceeds to step S250.

In step S250, the nonvolatile memory device 110 outputs data and ends the read operation.

In an embodiment, the nonvolatile memory device 110 may perform a read operation by the logical page. An embodiment of the inventive concept is exemplified in FIG. 10 as a read operation is associated with a logical page. The nonvolatile memory device 110 may perform the read operation described with reference to FIG. 10 with respect to four (or N) logical pages, respectively.

Figure 11:
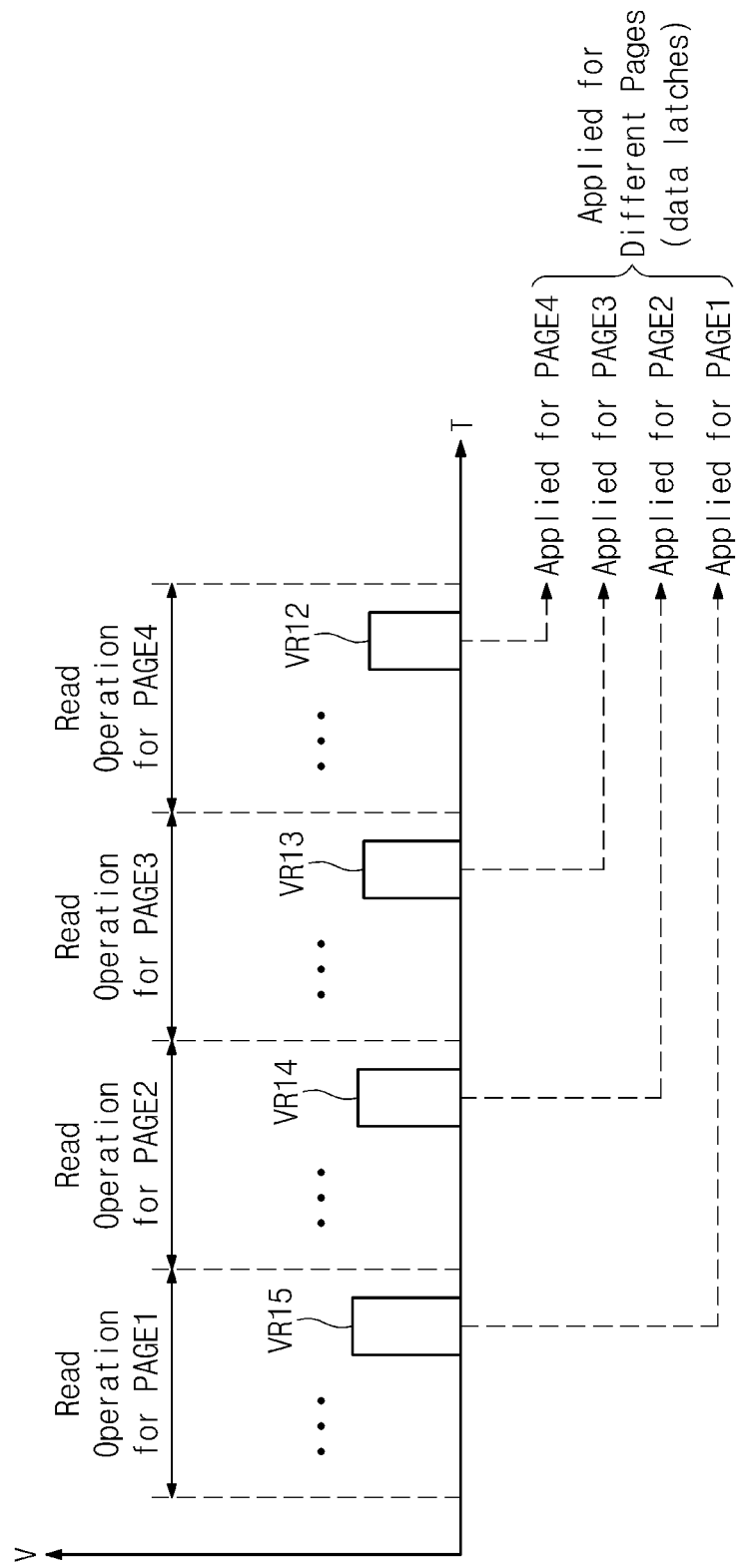
FIG. 11 illustrates a diagram of an example of a read operation of FIG. 10.

FIG. 11 illustrates a diagram of an example of a read operation of FIG. 10. In FIG. 11, the abscissa represents a time T, and the ordinate represents a voltage V applied to a selected word line.

Referring to FIGS. 1, 2, 7, 10, and 11, read operations about first to fourth logical pages PAGE1 to PAGE4 are respectively performed. In FIG. 11, an embodiment of the inventive concept is exemplified as read operations about the first to fourth pages PAGE1 to PAGE4 are sequentially performed. However, in other embodiments read operations about the first to fourth pages PAGE1 to PAGE4 may for example be performed in an arbitrary order. The first to fourth pages PAGE1 to PAGE4, that is, the first to fourth logical pages may correspond to first to fourth bits programmed in a memory cell, respectively.

The four (or N) most adjacent read voltages including the fourteenth read voltage VR 14 of the second highest voltage and the fifteenth read voltage VR15 of the highest voltage are used to be distributed at the four (or N) logical pages. The most adjacent four (or N) read voltages are used to determine different bits of a bit pattern BP programmed in each memory cell.

For example, as shown in FIG. 11 the fifteenth read voltage VR15 is assigned to the first logical page PAGE1 and is used to determine the first bit of the bit pattern BP. The fourteenth read voltage VR14 is assigned to the second logical page PAGE2 and is used to determine the second bit of the bit pattern BP. The thirteenth read voltage VR13 is assigned to the third logical page PAGES and is used to determine the third bit of the bit pattern BP. The twelfth read voltage VR12 is assigned to the fourth logical page PAGE4 and is used to determine the fourth bit of the bit pattern BP.

Figure 12:
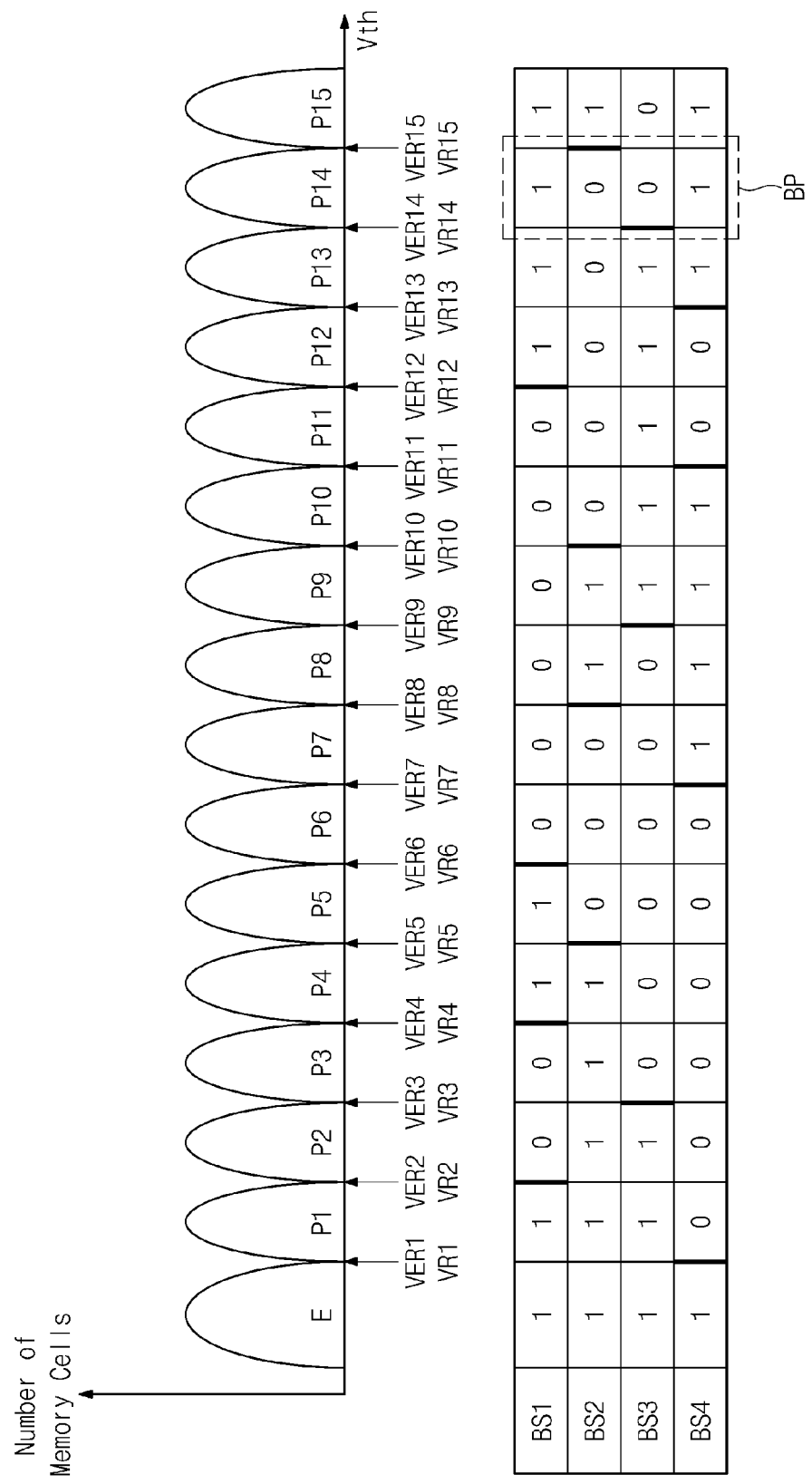
FIG. 12 illustrates a diagram of bit patterns and bit streams which support a program operation described with reference to FIGS. 6, 8, and 9 and a read operation described with reference to FIGS. 5, 10, and 11.

FIG. 12 illustrates a diagram of bit patterns and bit streams which support a program operation described with reference to FIGS. 6, 8, and 9 and a read operation described with reference to FIGS. 5, 10, and 11. In a graph at the top of FIG. 12, the abscissa represents a threshold voltage Vth, and the ordinate represents the number of memory cells MC. A table at the bottom of FIG. 12 shows bit patterns BP and bit streams BS associated with the erase state E and the first to fifteenth program states P1 to P15.

In an embodiment, the number of transition points in each bit stream may be limited to four or less. For example, when N bits are programmed in each memory cell, the number of transition points in each bit stream may have an upper limit or a lower limit corresponding to a value "2N/N". The transition points are indicated by the bold lines in the lower portion of FIG. 12. The number of transition points in each stream may correspond to the number of read voltages for reading each logical page. As the number of read voltages for reading each logical page increases, a time taken to read a logical page (hereinafter referred to as "logical page read time") may increase. As the number of read voltages for reading each logical page decreases, the logical page read time may decrease. When the numbers of read voltages for logical pages are unevenly assigned, a read time variation may increase for each logical page. The nonvolatile memory device 110 according to an embodiment of the inventive concept may support a program operation and a read operation in which the number of read voltages of logical pages, that is, the number of transition points of bit streams BS1 to BS4 is evenly assigned, thereby improving the read speed.

In an embodiment, when the number of bits to be programmed in a memory cell is N, the total number of read voltages or the total number of transition points may be (2N-1). The nonvolatile memory device according to an embodiment of the inventive concept may perform a program operation and a read operation such that the number of transition points of each bit stream or the number of read voltages of each logical page has an upper limit or a lower limit corresponding to a value "$2^N/N$".

For example, when N is four, four logical pages may be programmed in memory cells. The four logical pages may correspond to four bit streams respectively. The number of read voltages about a bit stream among four bit streams or the number of transition points about the bit stream may be 3, and the number of read voltages about each of remaining bit streams or the number of transition points thereabout may be 4. For example, when N is 5, five logical pages may be programmed in memory cells. The five logical pages may correspond to five bit streams respectively. The number of read voltages about a bit stream among five bit streams or the number or transition points thereabout may be 7, and the number of read voltages about each of remaining bit streams or the number of transition points thereabout may be 6. Therefore, the number of read voltages or the number of transition points may be evenly distributed at (or assigned to) logical pages or bit streams.

As illustrated in FIG. 12, a bit pattern of an erase state E is "1111", a bit pattern of the first program state P1 is "1110", a bit pattern of the second program state P2 is "0110", and a bit pattern of the third program state P3 is "0100". A bit pattern of the fourth program state P4 is "1100", a bit pattern of the fifth program state P5 is "1000", a bit pattern of the sixth program state P6 is "0000", and a bit pattern of the seventh program state P7 is "0001". A bit pattern of the eighth program state P8 is "0101", a bit pattern of the ninth program state P9 is "0111", a bit pattern of the tenth program state P10 is "0011", and a bit pattern of the eleventh program state P11 is "0010". A bit pattern of the twelfth program state P12 is "1010", a bit pattern of the thirteenth program state P13 is "1011", a bit pattern of the fourteenth program state P14 is "1001", and a bit pattern of the fifteenth program state P15 is "1101".

As illustrated in FIG. 12, the first bit stream BS1 represents values of a bit (i.e., a first bit) in a first logical page programmed at memory cells and is "1100110000001111" or "0011001111110000" which is inverted corresponding to the erase state E and the first to fifteenth program states P1 to P15, respectively. The second bit stream BS2 represents values of a bit (i.e., a second bit) in a second logical page programmed at the memory cells and is "1111100011000001" or "0000011100111110" which is inverted corresponding to the erase state E and the first to fifteenth program states P1 to P15, respectively. The third bit stream BS3 represents values of a bit (i.e., a third bit) in a third logical page programmed at the memory cells and is "1110000001111100" or "0001111110000011" which is inverted corresponding to the erase state E and the first to fifteenth program states P1 to P15, respectively. The fourth bit stream BS4 represents values of a bit (i.e., a fourth bit) in a fourth logical page programmed at the memory cells and is "1000000111100111" or "0111111000011000" which is inverted corresponding to the erase state E and the first to fifteenth program states P1 to P15, respectively. The above-mentioned patterns of the first to fourth bit streams may be the only one where the highest four read levels are distributed to the first to fourth bit streams when each memory cell stored four bits.

One transition point may occur in a portion of a bit stream corresponding to the program states P12 to 15 associated with the most adjacent four (or N) verification voltages VER12 to VER15 including the fifteenth verification voltage VER15 of the highest level and the fourteenth verification voltage VER14 of the second highest level, or no transition point may occur therein.

One transition point may occur in a portion of a bit stream corresponding to the program states P11 to P15 associated with the most adjacent four (or N) read voltages VR12 to VR15 including the fifteenth read voltage VR15 and the fourteenth read voltage VR14. The most adjacent four (or N) read voltages VR12 to VR15 may be used to determine different bits of a bit pattern BP programmed in a memory cell. That is, the most adjacent four (or N) read voltages VR12 to VR15 may be used to determine different logical pages programmed in memory cells.

In each bit stream, the number of transition points may be 4 (or either have an upper limit or a lower limit corresponding to a value of "$2^N/N$").

An embodiment of the inventive concept is exemplified in FIG. 12 as verification voltages VER1 to VER15 and the read voltages VR1 to VR15 have the same respective levels. That is, for example, verification voltage VER1 has the same level as read voltage VR1. However, in other embodiments the verification voltages VER1 to VER15 and the read voltages VR1 to VR15 may have respective different levels.

Figure 13:
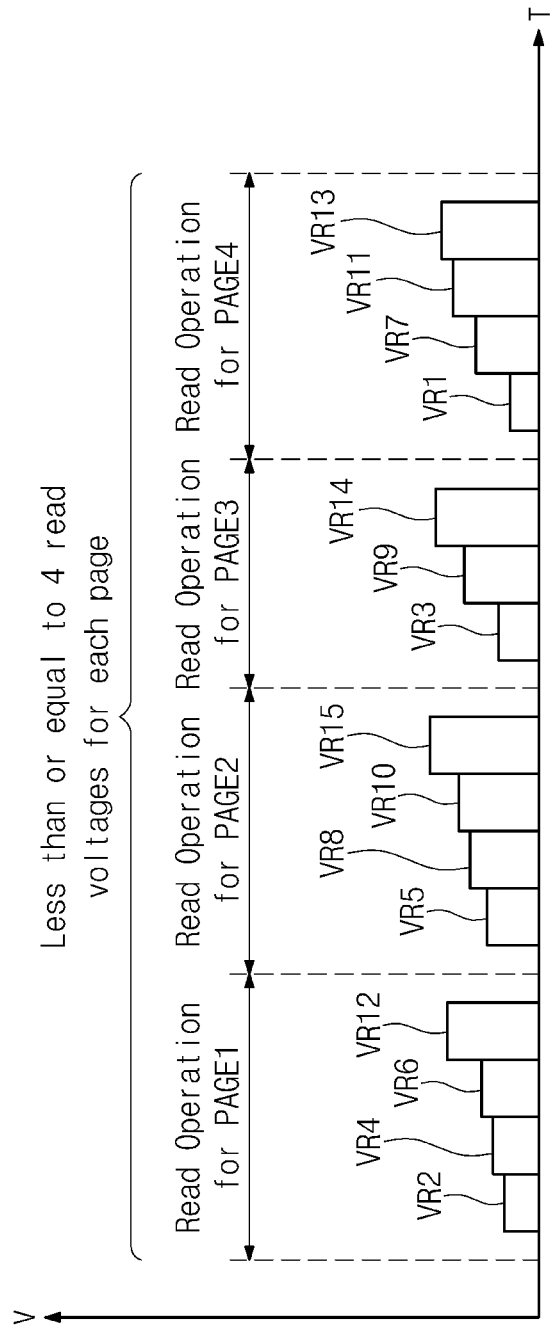
FIG. 13 illustrates an example of a read operation performed according to bit patterns and bit streams of FIG. 12.

FIG. 13 illustrates an example of a read operation performed according to bit patterns and bit streams of FIG. 12. In FIG. 13, the abscissa represents a time T, and the ordinate represents a voltage V applied to a selected word line.

Referring to FIGS. 1, 2, 12, and 13, a read operation may be performed with respect to first to fourth logical pages PAGE1 to PAGE4, respectively.

A first bit stream BS1 corresponding to a first bit programmed in each memory cell has transition points at positions corresponding to read voltages including second, fourth, sixth, and twelfth read voltages VR2, VR4, VR6 and VR12. Therefore, the second, fourth, sixth, and twelfth read voltages VR2, VR4, VR6 and VR12 are sequentially applied when a read operation is performed with respect to a first logical page of first bits respectively programmed in memory cells.

A second bit stream BS2 corresponding to a second bit programmed in each memory cell has transition points at positions corresponding to read voltages including fifth, eighth, tenth, and fifteenth read voltages VR5, VR8, VR10 and VR15. Therefore, the fifth, eighth, tenth, and fifteenth read voltages VR5, VR8, VR10 and VR15 are sequentially applied when a read operation is performed with respect to a second logical page of second bits respectively programmed in memory cells.

A third bit stream BS3 corresponding to a third bit programmed in each memory cell may has transition points at positions corresponding to read voltages including third, ninth, and fourteenth read voltages VR3, VR9 and VR14. Therefore, the third, ninth, and fourteenth read voltages VR3, VR9 and VR14 are sequentially applied when a read operation is performed with respect to a third logical page of third bits respectively programmed in memory cells.

A fourth bit stream BS4 corresponding to a fourth bit programmed in each memory cell has transition points at positions corresponding to read voltages including first, seventh, eleventh and thirteenth read voltages VR1, VR7, VR11 and VR13. Therefore, the first, seventh, eleventh and thirteenth read voltages VR1, VR7, VR11 and VR13 are sequentially applied when a read operation is performed with respect to a fourth logical page of fourth bits respectively programmed in memory cells.

The most adjacent four (or N) read voltages VR12 to VR15 may be used to determine different bits of a bit pattern BP programmed in each memory cell. Each bit stream has a transition point within a threshold voltage zone corresponding to the program states P11 to P15 corresponding to the most adjacent four (or N) read voltages VR12 to VR15.

Figure 14:
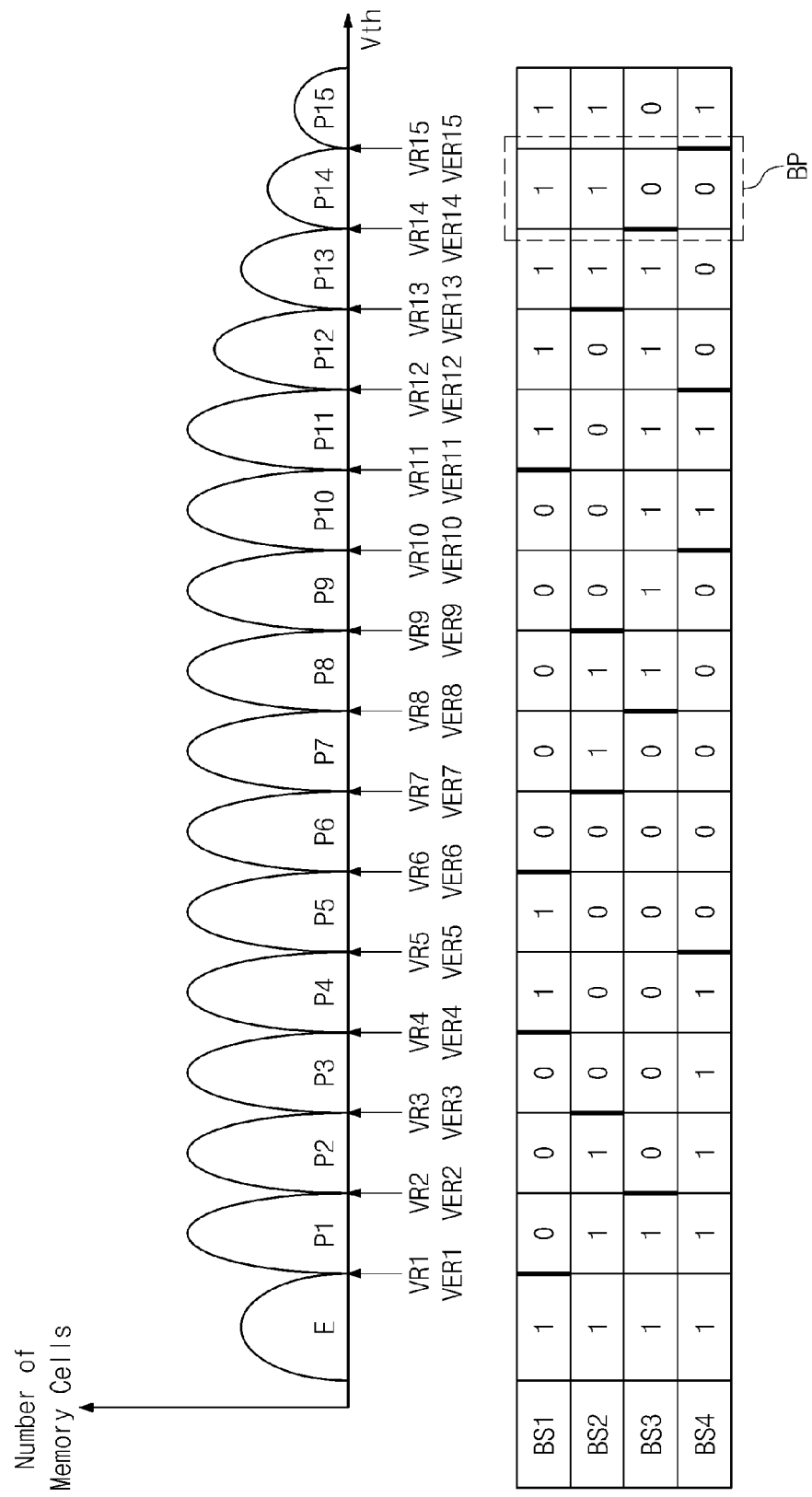
FIG. 14 illustrates an application of bit patterns and bit streams which support a program operation described with reference to FIGS. 6, 8, and 9 and a read operation described with reference to FIGS. 5, 10, and 11.

FIG. 14 illustrates an application of bit patterns and bit streams which support a program operation described with reference to FIGS. 6, 8, and 9 and a read operation described with reference to FIGS. 5, 10, and 11. In a graph at the top of FIG. 14, the abscissa represents a threshold voltage Vth, and the ordinate represents the number of memory cells MC. A table at the bottom of FIG. 14 shows bit patterns BP and bit streams BS associated with the erase state E and the first to fifteenth program states P1 to P15.

In an embodiment, data received from the controller may be state-shaping encoded data. The state-shaping may be encoding which makes it possible to decrease the number of memory cells to be programmed to logical states with the high probability of error occurrence, and to increase the number of memory cells to be programmed to different logical states other than the logical states with the high probability of error. In an embodiment, the state-shaping may allow the number of bit patterns of the highest program state P15 to decrease.

In FIG. 14, an embodiment of the inventive concept is exemplified as the number of fifteenth program states P15 is the smallest. As the number of fifteenth program states P15 decreases, the number of program states such as the erase state E and the twelfth to fourteenth program states P12 to P14 may also decrease, similar to the fifteenth program state.

As illustrated in FIG. 14, when the number of fourteenth and fifteenth program states P14 and P15 decreases, the number of memory cells of which values are determined by the fifteenth read voltage VR15 may also decrease, and thus the number of read errors which are generated by the fifteenth read voltage VR15 may decrease. Therefore, features of the inventive concept will be applied to the most adjacent four (or N) read voltages VR11 to VR14, which includes the fourteenth read voltage VR14 of the second highest level other than the fifteenth read voltage VR15. Likewise, features of the inventive concept will be applied to the most adjacent four (or N) verification voltages VER11 to VER14 other than the fifteenth verification voltage VER15 of the highest level.

For example, one transition point or no transition point is formed in bits of a bit stream corresponding to the program states P11 to P14 associated with the most adjacent four (or N) verification voltages VER11 to VER14 including the fourteenth verification voltage VER14 other than the fifteenth verification voltage VER15.

With regard to bit streams, one transition point or no transition point is formed in bits of a bit stream corresponding to the program states P10 to P14 associated with the most adjacent four (or N) read voltages VR11 to VR14 including the fourteenth read voltage VR14 other than the fifteenth read voltage VR15. The most adjacent four (or N) read voltages VR11 to VR14 may be used to determine different bits of a bit pattern BP programmed in a memory cell.

In each bit stream, the number of transition points may be 4 (or either have an upper limit or a lower limit corresponding to a value of "$2^N/N$").

As illustrated in FIG. 14, a bit pattern of an erase state E is "1111", a bit pattern of the first program state P1 is "0111", a bit pattern of the second program state P2 is "0101", and a bit pattern of the third program state P3 is "0001". A bit pattern of the fourth program state P4 is "1001", a bit pattern of the fifth program state P5 is "1000", a bit pattern of the sixth program state P6 is "0000", and a bit pattern of the seventh program state P7 is "0100". A bit pattern of the eighth program state P8 is "0110", a bit pattern of the ninth program state P9 is "0010", a bit pattern of the tenth program state P10 is "0011", and a bit pattern of the eleventh program state P11 is "1011". A bit pattern of the twelfth program state P12 is "1010", a bit pattern of the thirteenth program state P13 is "1110", a bit pattern of the fourteenth program state P14 is "1100", and a bit pattern of the fifteenth program state is P15 "1101".

As illustrated in FIG. 14, the first bit stream BS1 represents values of a bit (i.e., a first bit) in a first logical page programmed at memory cells and is "1000110000011111" corresponding to the erase state E and the first to fifteenth program states P1 to P15, respectively. The second bit stream BS1 represents values of a bit (i.e., a second bit) in a second logical page programmed at memory cells and is "1110000110000111" corresponding to the erase state E and the first to fifteenth program states P1 to P15, respectively. The third bit stream BS3 represents values of a bit (i.e., a third bit) in a third logical page programmed at the memory cells and is "1100000011111100" corresponding to the erase state E and the first to fifteenth program states P1 to P15, respectively. The fourth bit stream BS4 represents values of a bit (i.e., a fourth bit) in a fourth logical page programmed at the memory cells and is "1111100000110001" corresponding to the erase state E and the first to fifteenth program states P1 to P15, respectively.

An embodiment of the inventive concept is exemplified in FIG. 14 as verification voltages VER1 to VER15 and read voltages VR1 to VR15 have the same respective levels. That is, for example, verification voltage VER1 has the same level as read voltage VR1. However, in other embodiments of the inventive concept the verification voltages VER1 to VER15 and the read voltages VR1 to VR15 may have respective different levels.

Figure 15:
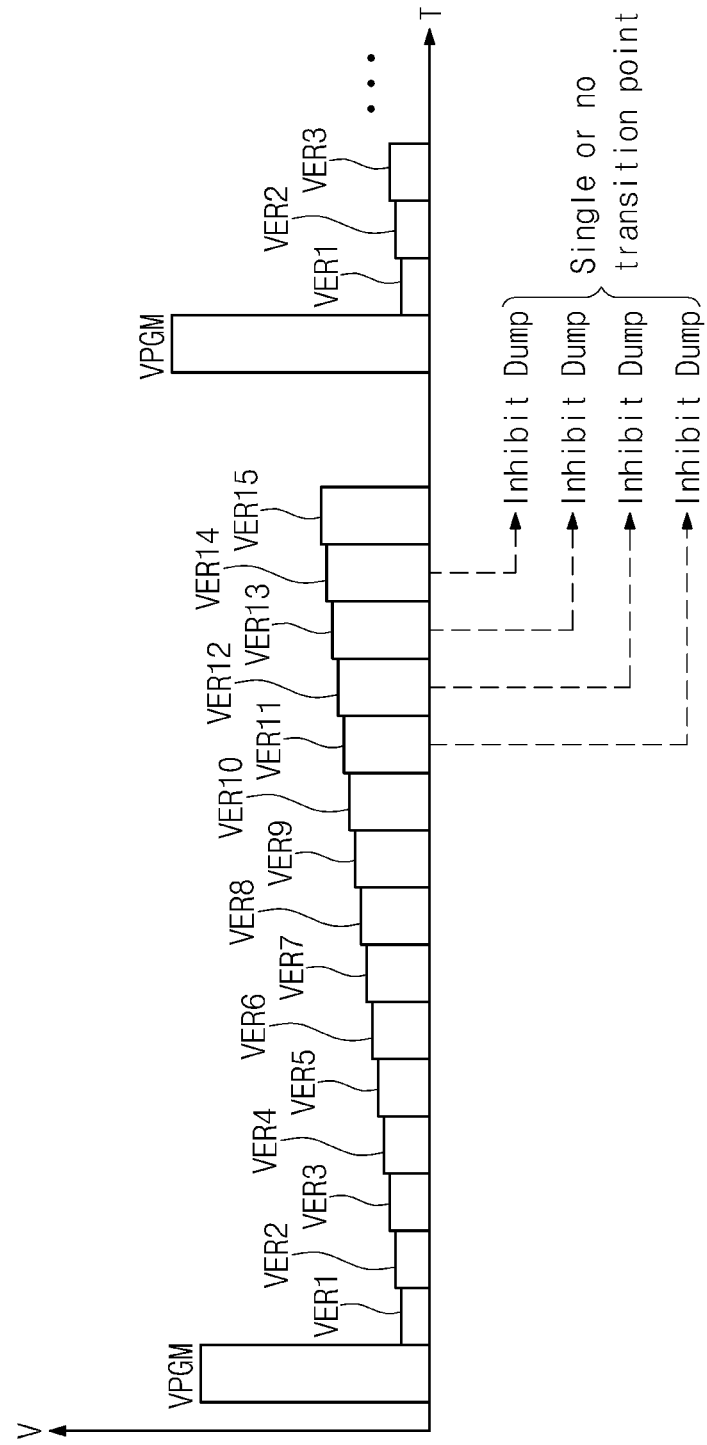
FIG. 15 illustrates a diagram of an example of a program operation performed according to bit patterns and bit streams of FIG. 14.

FIG. 15 illustrates a diagram of an example of a program operation performed according to bit patterns and bit streams of FIG. 14. In FIG. 15, the abscissa represents a time T, and the ordinate represents a voltage V applied to a selected word line. Referring to FIGS. 1, 2, 14, and 15, a program voltage VPGM is applied to the selected word line in a program section, and first to fifteenth verification voltages VER1 to VER15 are sequentially applied in a verification section.

An inhibit dump is performed in page buffers, in which corresponding bit patterns are stored, while the most adjacent four (or N) verification voltages VER11 to VER14 including the fourteenth verification voltage VER14 other than the fifteenth verification voltage VER15 are applied. With regard to bit streams, one transition point or no transition point may be formed in a bit stream of bit patterns corresponding to the most adjacent four (or N) verification voltages VER11 to VER14.

Figure 16:
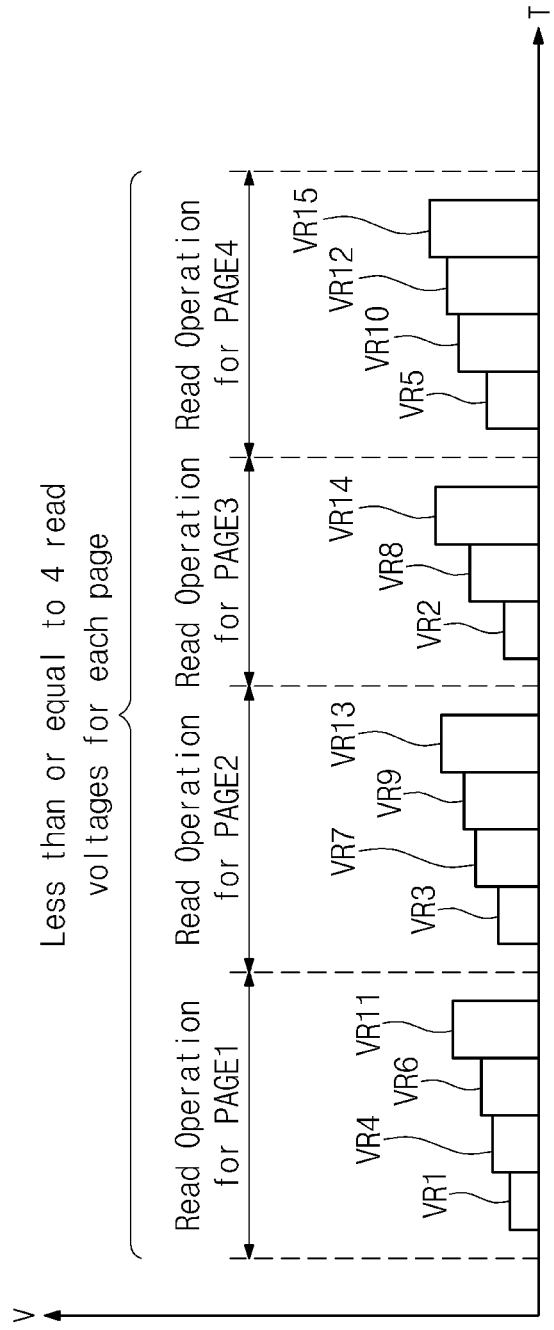
FIG. 16 illustrates a diagram of an example of a read operation performed according to bit patterns and bit streams of FIG. 14.

FIG. 16 illustrates a diagram of an example of a read operation performed according to bit patterns and bit streams of FIG. 14. In FIG. 16, the abscissa represents a time T, and the ordinate represents a voltage V applied to a selected word line. Referring to FIGS. 1, 2, 14, and 16, a read operation may be performed with respect to first to fourth logical pages PAGE1 to PAGE4, respectively.

The first bit stream BS1 corresponding to first bit programmed in each memory cell may has transition points at positions corresponding to read voltages including first, fourth, sixth, and eleventh read voltages VR1, VR4, VR6, and VR11. Therefore, the first, fourth, sixth, and eleventh read voltages VR1, VR4, VR6, and VR11 are sequentially applied while a read operation is performed with respect to the first logical page of the first bits respectively programmed in memory cells.

The second bit stream BS2 corresponding to a second bit programmed in each memory cell has transition points at positions corresponding to read voltages including third, seventh, ninth, and thirteenth read voltages VR3, VR7, VR9, and VR13. Therefore, the third, seventh, ninth, and thirteenth read voltages VR3, VR7, VR9, and VR13 are sequentially applied while a read operation is performed with respect to the second logical page of the second bits respectively programmed in the memory cell.

The third bit stream BS3 corresponding to a third bit programmed in each memory cell has transition points at positions corresponding to read voltages including second, eighth, and fourteenth read voltages VR2, VR8, and VR14. Therefore, the second, eighth, and fourteenth read voltages VR2, VR8, and VR14 are sequentially applied while a read operation is performed with respect to the third logical page of the third bits respectively programmed in the memory cells.

The fourth bit stream BS4 corresponding to a fourth bit programmed in each memory cell has transition points at positions corresponding to read voltages including fifth, tenth, twelfth, and fifteenth read voltages VR5, VR10, VR12, and VR15. Therefore, the fifth, tenth, twelfth, and fifteenth read voltages VR5, VR10, VR12, and VR15 are sequentially applied while a read operation is performed with respect to the fourth logical page of the fourth bits respectively programmed in the memory cell.

The most adjacent four (or N) read voltages VR11 to VR14 are used to determine different bits of a bit pattern BP programmed in each memory cell. For example, the most adjacent four (or N) read voltages VR11 to VR14 are used to determine different logical pages programmed in the memory cells. Each bit stream may have a transition point within a threshold voltage zone corresponding to the program states P10 to P14 corresponding to the most adjacent four (or N) read voltages VR11 to VR14.

The above-described embodiments are described under the condition that the k-th bit to be programmed in each memory cell corresponds to a k-th logical page and a k-th bit stream. However, reference numerals of each bit, each logical page, and each bit stream are used herein merely to distinguish between components, not to limit the characteristic of the components. For example, reference numerals assigned to each bit, each logical page, and each bit stream should not limit an order to program memory cells and an order to identify memory cells using an address.

Figure 17:
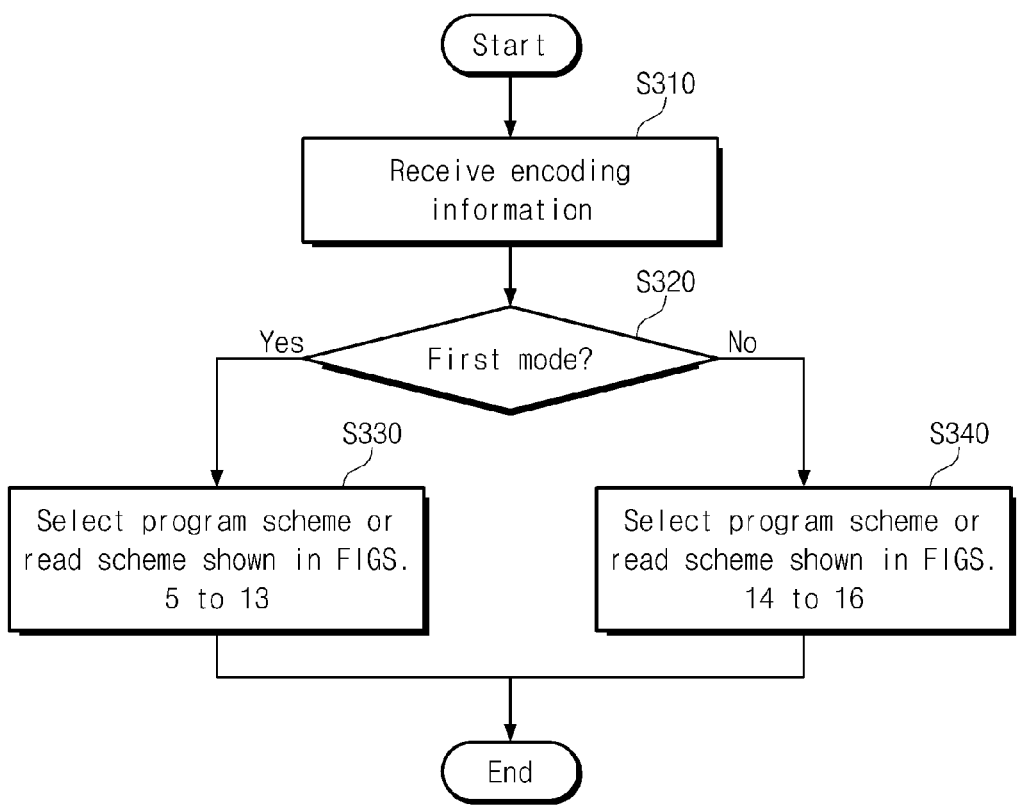
FIG. 17 illustrates a flow chart of a method in which a nonvolatile memory device selects an operation mode, according to an embodiment of the inventive concept.

FIG. 17 illustrates a flow chart of a method in which a nonvolatile memory device 100 selects an operation mode, according to an embodiment of the inventive concept. Referring to FIGS. 1 and 17, in step S310, the control logic circuit 119 receives encoding information from the controller.

In step S320, the control logic circuit 119 determines whether the encoding information indicates a first mode or a second mode. When the encoding information indicates the first mode (Yes in step S320), thereafter in step 5330 the control logic circuit 119 selects a program scheme or a read scheme described with reference to FIGS. 5 to 13. When the encoding information indicates the second mode (No in step S320), thereafter in step 5340 the control logic circuit 119 selects a program scheme or a read scheme described with reference to FIGS. 14 to 16.

For example, after a manufacturing process including a test procedure, the nonvolatile memory device may receive encoding information and may select either of the first and second operation modes to store the encoding information in a one-time program (OTP) block. Afterwards, the nonvolatile memory device may perform based on the selected operation mode. For example, the nonvolatile memory device 110 may receive encoding information and may select an operation mode to store the encoding information in a nonvolatile storage component such as an electrical fuse. The nonvolatile memory device 110 may maintain the operation mode until the nonvolatile storage component is updated with new encoding information.

For example, when powered up and initialized, the nonvolatile memory device 110 may receive encoding information and may select an operation mode based on the received encoding information. For example, the nonvolatile memory device 100 may be configured to select or change the operation mode whenever encoding information is received.

Figure 18:
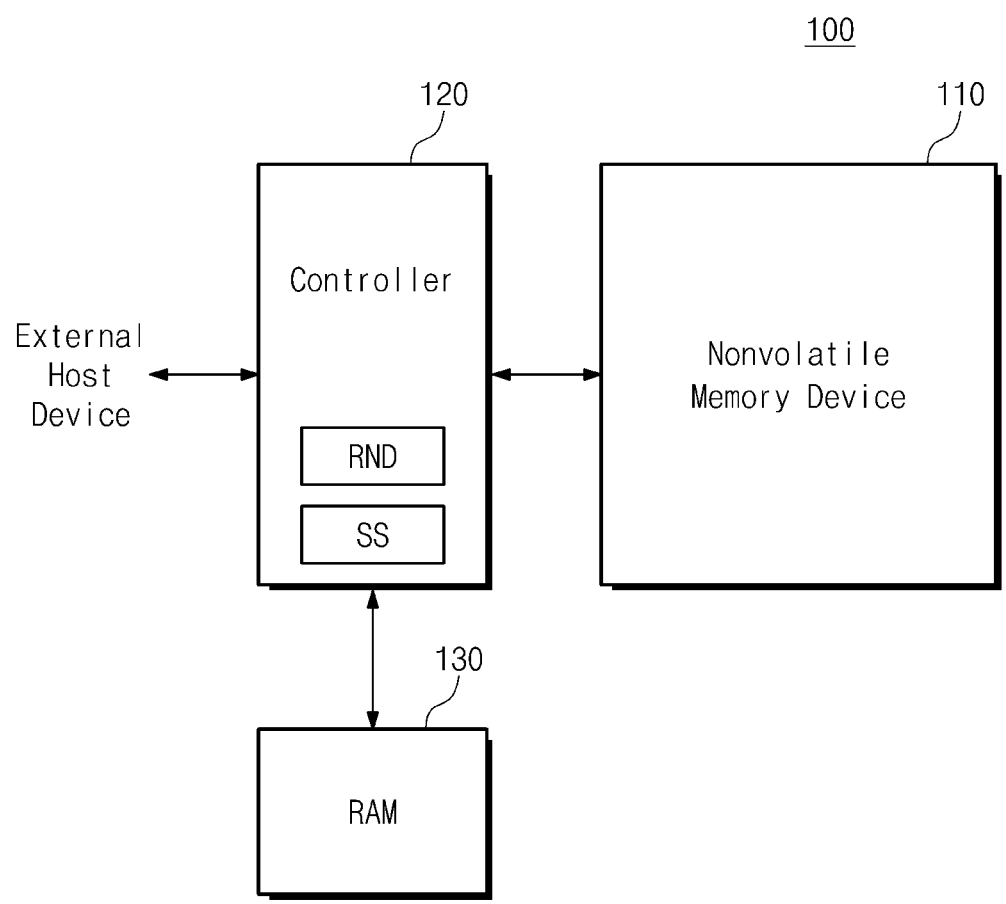
FIG. 18 illustrates a block diagram of a storage device according to an embodiment of the inventive concept.

FIG. 18 illustrates a block diagram of a storage device 100 according to an embodiment of the inventive concept. Referring to FIGS. 1 and 18, a storage device 100 includes a nonvolatile memory device 110, a controller 120, and a random access memory (RAM) 130.

For example, the nonvolatile memory device 110 may operate as described with reference to FIGS. 1 to 17. The nonvolatile memory device 110 may perform a write, read or erase operation under control of the controller 120. The nonvolatile memory device 110 may receive a command and an address from the controller 120 through an input/output channel. The nonvolatile memory device 110 may exchange data with the controller 120 through the input/output channel The nonvolatile memory device 110 may exchange a control signal with the controller 120 through a control channel For example, the nonvolatile memory device 110 may receive, from the controller 120, at least one of a chip enable signal/CE for selecting at least one of a plurality of nonvolatile memory chips in the nonvolatile memory device 110, a command latch enable signal CLE indicating that a signal received from the controller 120 through the input/output channel is the command, an address latch enable signal ALE indicating that a signal received from the controller 120 through the input/output channel is an address, a read enable signal/RE generated by the controller 120 at a read operation that is periodically toggled and used to tune timing, a write enable signal/WE activated by the controller 120 when the command or the address is transferred, a write protection signal/WP activated by the controller 120 to prevent unintended writing or erasing when a power changes, and a data strobe signal DQS used to adjust input synchronization about the data transferred through the input/output channel and generated from the controller 120 at a write operation so as to be periodically toggled. For example, the nonvolatile memory device 110 may output, to the controller 120, at least one of a ready/busy signal R/nB indicating whether the nonvolatile memory device 110 is performing a program, erase or read operation and a data strobe signal DQS used to adjust output synchronization about the data and generated from the read enable signal/RE by the nonvolatile memory device 110 so as to be periodically toggled.

The nonvolatile memory device 110 may include a flash memory. However, in other embodiments the nonvolatile memory device 110 may for example incorporate at least one of nonvolatile memory devices such as a phase-change RAM (PRAM), a magnetic RAM (MRAM), a resistive RAM (RRAM), and a ferroelectric RAM (FeRAM).

The controller 120 may control the nonvolatile memory device 110. For example, the controller 120 may control the nonvolatile memory device 110 through an input/output channel and a control channel so as to perform a write, read or erase operation.

The controller 120 may control the nonvolatile memory device 110 in response to control of an external host device (not illustrated). For example, the controller 120 may communicate with the external host device based on a format different from the format for communications with the nonvolatile memory device 110. A unit of data which the controller 120 conveys to the nonvolatile memory device 110 may be different from a unit of data which the controller 120 conveys to the external host device.

The controller 120 may use the RAM 130 as a working memory, a buffer memory, or a cache memory. The controller 120 may store data or codes, needed to manage the nonvolatile memory device 110, at the RAM 130. For example, the controller 120 may read data or codes needed to manage the nonvolatile memory device 110 from the nonvolatile memory device 110 and may load the read data or codes on the RAM 130 for driving.

The controller 120 may include a randomizer RND and a state shaper SS. The randomizer RND may randomize data to be written at the nonvolatile memory device 110 or may derandomize data read from the nonvolatile memory device 110. The randomizer RND may convert data such that bit patterns of data to be written at the nonvolatile memory device 110 are distributed to have an erase state E and first to fifteenth program states P1 to P15 evenly. The derandomization may restore the randomized data to original data.

The state shaper SS may perform state-shaping and restoration about data to be written at the nonvolatile memory device 110. With the state-shaping, data may be converted in such a way that the number of bit patterns of the highest program state P15 decreases. The restoration may be performed to restore state-shaped data to original data.

The RAM 130 may include at least one of a variety of random access memories, such as a static RAM (SRAM), a dynamic RAM (DRAM), a synchronous DRAM (SRAM), a PRAM, a MRAM, a RRAM, and a FRAM.

The nonvolatile memory device 110 may include a plurality of nonvolatile memory chips. In an embodiment, the controller 120 and the nonvolatile memory chips may be interconnected based on a channel and a way. One channel may include one data channel and one control channel One data channel may include eight data lines. One control channel may include control lines for transferring the chip enable signal (/CE), the command latch enable signal (CLE), the address latch enable signal (ALE), the read enable signal (/RE), the write enable signal (/WE), the write protect signal (/WP), and the ready/busy signal (R/nB).

Nonvolatile memory chips connected to one channel may constitute a way. When connected to one channel, n nonvolatile memory chips may compose an n-way. Nonvolatile memory chips belonging to one way may share data lines and the control lines for transferring the command latch enable signal CLE, the address latch enable signal ALE, the read enable signal/RE, the write enable signal/WE, and the write protect signal/WP. Each of nonvolatile memory chips belonging to one way may communicate with the controller 120 through control lines dedicated to the chip enable signal/CE and the ready/busy signal R/nB.

The controller 120 may alternately access n-way nonvolatile memory chips connected to one channel The controller 120 may independently access nonvolatile memory chips connected with different channels. The controller 120 may alternately or simultaneously access nonvolatile memory chips connected with different channels.

In an embodiment, nonvolatile memory chips may be connected with the controller 120 in the form of a wide IO. For example, nonvolatile memory chips connected to different channels may share a control line for a chip enable signal/CE. Nonvolatile memory chips which share the control line for the chip enable signal/CE may be accessed at the same time. Data lines of different channels may be used at the same time, and thus a wide input/output bandwidth may be achieved.

The storage device 100 may include a solid state drive (SSD) or a hard disk drive (HDD). The storage device 100 may include memory cards, such as a PC card (personal computer memory card international association (PCM-CIA)), a compact flash (CF) card, a smart media card (e.g., SM, SMC), a memory stick, a multimedia card (e.g., MMC, RS-MMC, MMCmicro), an SD card (e.g., SD, miniSD, microSD, SDHC), a universal serial bus (USB) memory card, and a universal flash storage (UFS). The storage device 100 may include embedded memories, such as an embedded MultiMedia card (eMMC), a UFS, and a PPN (Perfect Page NAND).

In FIG. 18, an embodiment of the inventive concept is exemplified as the RAM 130 is disposed outside the controller 120. However, in other embodiments the storage device 100 may not include the RAM 130 disposed outside the controller 120. The controller 120 may use an internal RAM (refer to FIG. 20) as a buffer memory, a working memory, or a cache memory.

Figure 19:
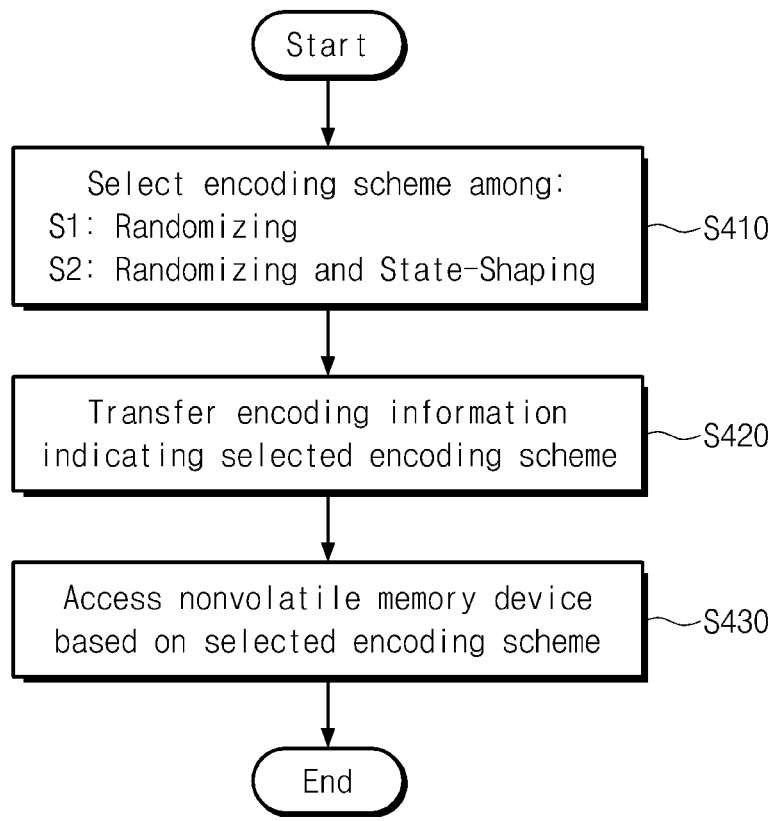
FIG. 19 illustrates a flow chart of an operating method of a storage device according to an embodiment of the inventive concept.

FIG. 19 illustrates a flow chart of an operating method of a storage device 100 according to an embodiment of the inventive concept. Referring to FIG. 19, in step S410 the controller 120 select one of a first scheme S1 and a second scheme S2 as an encoding scheme. For example, the first scheme S1 includes randomizing data using the randomizer RND. The second scheme S2 includes randomizing data using the randomizer RND and state-shaping the randomized data using the state shaper SS.

In step S420, the controller 120 transfers encoding information, which indicates the encoding scheme, to the nonvolatile memory device 110. As described with reference to FIG. 17, the nonvolatile memory device 110 may select the operating method based on the encoding information.

In step S430, the controller 120 accesses the nonvolatile memory device 110 based on the selected encoding scheme.

For example, when the first scheme S1 is selected, the controller 120 may randomize data to be written at the nonvolatile memory device 110 using the randomizer RND. The controller 120 may transfer the randomized data to the nonvolatile memory device 110. The nonvolatile memory device 110 may program the randomized data based on the program scheme described with reference to FIGS. 5 to 13. For example, the nonvolatile memory device 110 may receive all data corresponding to a physical page from the controller 120 and may program the received data through a program operation. The controller 120 may request a read operation from the nonvolatile memories 110. The nonvolatile memory device 110 may read data using the read scheme described with reference to FIGS. 5 to 13 and may output the read data to the controller 120. The controller 120 may derandomize data outputted from the nonvolatile memory device 110 using the randomizer RND.

For example, when the second scheme S2 is selected, the controller 120 may randomize data to be written at the nonvolatile memory device 110 using the randomizer RND. The controller 120 may state-shape the randomized data using the state shaper SS. The controller 120 may transfer the randomized, state-shaped data to the nonvolatile memory device 110. The nonvolatile memory device 110 may program the randomized, state-shaped data based on the program scheme described with reference to FIGS. 14 to 16. For example, the nonvolatile memory device 110 may receive all data corresponding to a physical page from the controller 120 and may program the received data through a program operation. The controller 120 may request a read operation from the nonvolatile memories 110. The nonvolatile memory device 110 may read data using the read scheme described with reference to FIGS. 14 to 16 and may output the read data to the controller 120. The controller 120 may restore data outputted from the nonvolatile memory device 110 to original data, using the state-shaper SS. The controller 120 may derandomize the restored data using the randomizer RND.

Figure 20:
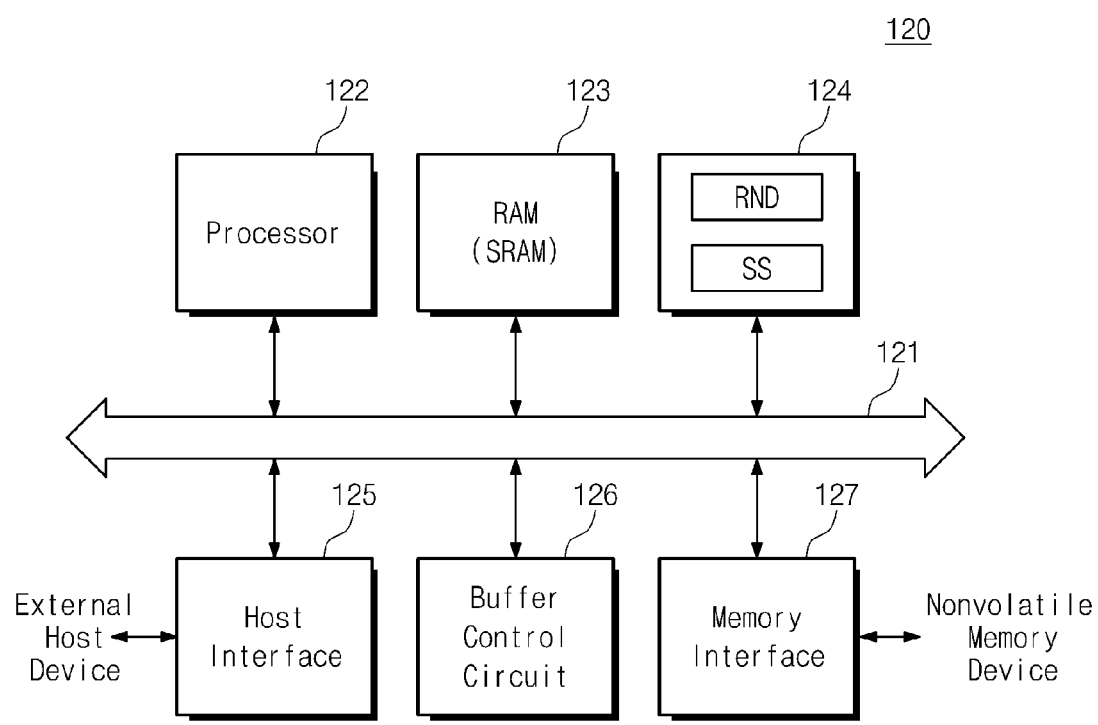
FIG. 20 illustrates a block diagram of a controller according to an embodiment of the inventive concept.

FIG. 20 illustrates a block diagram of a controller 120 according to an embodiment of the inventive concept. Referring to FIGS. 18-20, the controller 120 may include a bus 121, a processor 122, a RAM 123, a data processing block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125, may communicate with the nonvolatile memory device 110 through the memory interface 127, and may communicate with the RAM 130 through the buffer control circuit 126. The processor 122 may control the storage device 100 using the RAM 123 as a working memory, a cache memory, or a buffer memory.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include a static RAM (SRAM).

The data processing block 124 may be configured to convert data to be transferred to the nonvolatile memory device 110 or data received from the nonvolatile memory device 110. For example, the data processing block 124 may include the randomizer RND and the state-shaper SS described with reference to FIGS. 18 and 19.

The host interface 125 may communicate with the external host device under control of the processor 122. The host interface 125 may convey communications using at least one of various communication standards such as for example universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), load reduced DIMM (LRDIMM), and the like.

The buffer control circuit 126 may control the RAM 130 under control of the processor 122.

The memory interface 127 may communicate with the nonvolatile memory 110 under control of the processor 122. As described with reference to FIG. 1, the memory interface 127 may convey a command, an address, and data to the nonvolatile memory device 110 through the input/output channel The memory interface 127 may convey a control signal to the nonvolatile memory device 110 through the control channel In embodiments where the storage device 100 does not include the RAM 130, the controller 120 consequently may not include the buffer control circuit 126.

In an embodiment, the processor 122 may control the controller 120 using codes. The processor 122 may load codes from a nonvolatile memory device (e.g., a read only memory) that is implemented in the controller 120. Alternatively, the processor 122 may load codes from the nonvolatile memory device 110 through the memory interface 127.

In an embodiment, the bus 121 of the controller 120 may be divided into a control bus and a data bus. In an embodiment, the data bus may transfer data in the controller 120, and the control bus may transfer the following control information in the controller 120: a command and an address. The data bus and the control bus may be independent of each other to prevent mutual interference or influence. The data bus may be connected with the host interface 125, the buffer control circuit 126, the data processing block 124, and the memory interface 127. The control bus may be connected with the host interface 125, the processor 122, the buffer control circuit 126, the RAM 123, and the memory interface 127.

In an embodiment, the controller 120 may include an error correction block. The error correction block may perform an error correction operation. The error correction block may perform error correction encoding based on data to be written at the nonvolatile memory device 110 through the memory interface 127. The error correction encoded data may be transferred to the nonvolatile memory device 110 through the memory interface 127. The error correction block may perform error correction decoding about data received through the memory interface 127 from the nonvolatile memory device 110. In an embodiment, the error correction block may be connected to the bus 121 or may be included in the memory interface 127 as a component of the memory interface 127.

Figure 21:
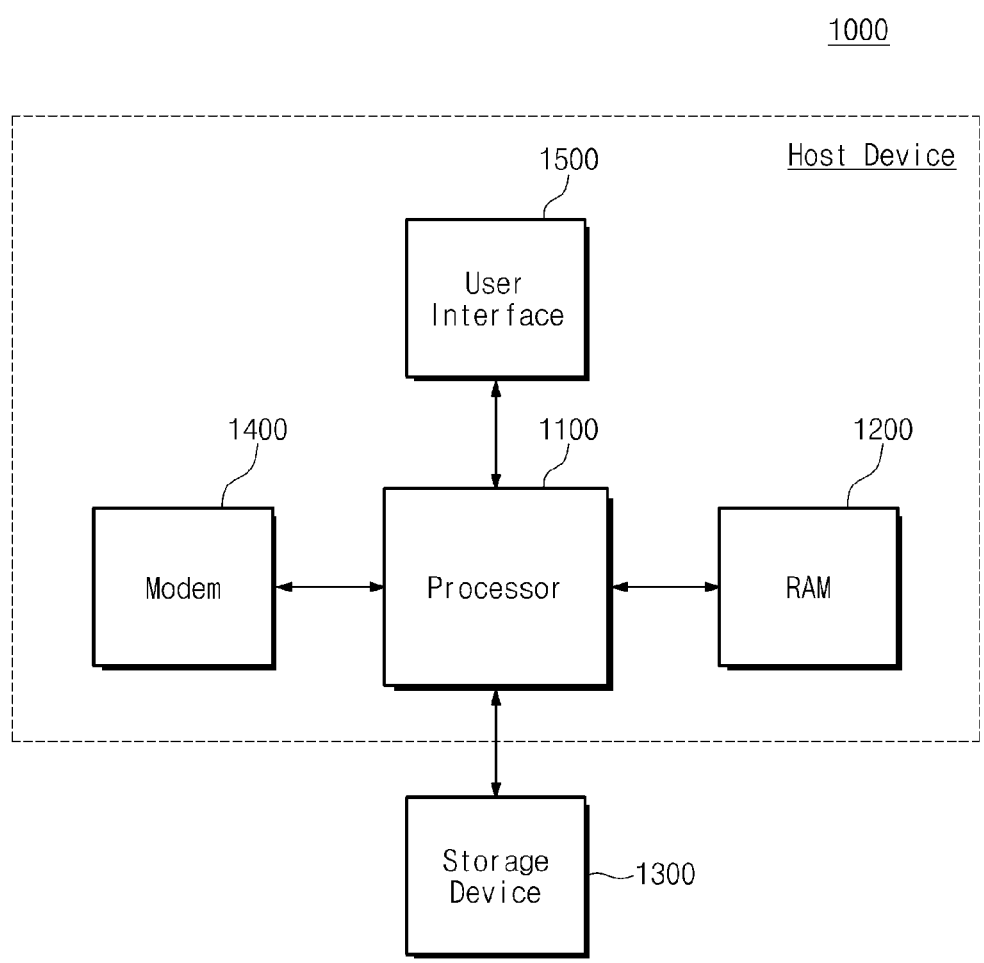
FIG. 21 illustrates a block diagram of a computing device according to an embodiment of the inventive concept.

FIG. 21 illustrates a block diagram of a computing device 1000 according to an embodiment of the inventive concept. Referring to FIG. 21, the computing device 1000 includes a processor 1100, a RAM 1200, a storage device 1300, a modem 1400, and a user interface 1500.

The processor 1100 may control an overall operation of the computing device 100 and may perform a logic operation. The processor 1100 may be a data processing device which is based on hardware including a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data at the RAM 1200 temporarily. The processor 1100 may execute codes using the RAM 1200 and may process data. The processor 1100 may execute a variety of software, such as an operating system and an application, using the RAM 1200. The processor 1100 may control an overall operation of the computing device 1000 using the RAM 1200. The RAM 1200 may for example include volatile memory such as SRAM, DRAM, SDRAM, and the like or nonvolatile memory such as PRAM, MRAM, RRAM, FRAM, and the like.

The storage device 1300 may communicate with the processor 1100. The storage device 1300 may be used to store data for a long time. That is, the processor 1100 may store data, which is to be stored for a long time, at the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In an embodiment, the processor 1100 may load source codes stored at the storage device 1300 onto the RAM 1200 and may execute the codes, thereby driving a variety of software, such as an operating system, applications, and the like. The processor 1100 may load data stored at the storage device 1300 onto the RAM 1200 and may process data loaded on the RAM 1200. The processor 1100 may store long-term data among data stored at the RAM 1200, at the storage device 1300.

The storage device 1300 may include for example nonvolatile memory, such as flash memory, PRAM, MRAM, RRAM, FRAM, and the like.

The modem 1400 may communicate with an external device under control of the processor 1100. For example, the modem 1400 may communicate with the external device in a wired or wireless manner The modem 1400 may communicate with the external device, based on at least one of wireless communications standards such as for example long term evolution (LTE), WiMax, global system for mobile communication (GSM), code division multiple access (CDMA), Bluetooth, near field communication (NFC), Wi-Fi, radio frequency identification (RFID), and the like or wired communications standards such as for example universal serial bus (USB), SATA, HSIC, SCSI, Firewire, peripheral component interconnection (PCI), PCI express (PCIe), nonvolatile memory express (NVMe), universal flash storage (UFS), secure digital (SD), SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), multimedia card (MMC), embedded MMC (eMMC), and so on.

The user interface 1500 may communicate with a user under control of the processor 1100. For example, the user interface 1500 may include user input interfaces such as a keyboard, a keypad, buttons, a touch panel, a touch screen, a touch pad, a touch ball, a camera, a microphone, a gyroscope sensor, a vibration sensor, and the like. The user interface 150 may further include user output interfaces such as a liquid crystal display (LCD), an organic light-emitting diode (OLED) display device, an active matrix OLED (AMOLED) display device, a light-emitting diode (LED), a speaker, a motor, and the like.

The processor 1100, RAM 1200, modem 1400, and user interface 1500 may constitute a host device that communicates with the storage device 1300. The storage device 1300 may include the storage device 100 of FIG. 18 according to an embodiment of the inventive concept. When the storage device 1300 includes a storage device according to an embodiment of the inventive concept, the speed at which the storage device 1300 is accessed may be improved, and the reliability of data which the host device writes at the storage device 1300 may be improved. Therefore, the speed and reliability of the computing device 1000 may be improved.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

According to an embodiment of the inventive concept, the number of times that a page is read may be limited within a reference value, thereby improving a read speed of the nonvolatile memory device.

In addition, read operations about high threshold voltage states may be distributed to cover pages, thereby preventing a bit error from occurring at a page and improving the reliability of the nonvolatile memory device.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nonvolatile memory device comprising:
a memory cell array comprising a plurality of memory cells;
a row decoder circuit connected to the memory cell array through a plurality of word lines and configured to apply read voltages to a selected word line during a read operation; and
a page buffer circuit connected to the memory cell array through bit lines,
wherein during a read operation performed with respect to each of N logical pages (N being a positive integer) of memory cells connected to the selected word line, the row decoder circuit is configured to apply a read voltage from among adjacent N read voltages to the selected word line without applying the other N-1 read voltages other than the read voltage to the selected word line, and
wherein the adjacent N read voltages comprise a second highest read voltage among the read voltages.

2. The nonvolatile memory device of claim 1, wherein the adjacent N read voltages comprise a highest read voltage among the read voltages.

3. The nonvolatile memory device of claim 1, wherein the adjacent N read voltages do not comprise a highest read voltage among the read voltages.

4. The nonvolatile memory device of claim 1, wherein during read operations performed with respect to different logical pages among the N logical pages, the row decoder circuit is configured to apply different read voltages from among the adjacent N read voltages to the selected word line.

5. The nonvolatile memory device of claim 1, wherein during read operations performed with respect to the N logical pages, the row decoder circuit is configured to apply to the selected word line read voltages of a number less than or equal to an upper limit or a lower limit corresponding to a value of $2^N/N$.

6. The nonvolatile memory device of claim 1, wherein the adjacent N read voltages are determined according to information received from an external device.

7. The nonvolatile memory device of claim 1, wherein the memory cell array comprises a three-dimensional structure, and wherein each of the plurality of memory cells comprises a charge trap layer.

8. The nonvolatile memory device of claim 7, wherein the plurality of memory cells are stacked in a direction perpendicular to a substrate.

* * * * *